US012805007B2

(12) United States Patent
Zhou et al.

(10) Patent No.: US 12,805,007 B2
(45) Date of Patent: Nov. 17, 2026

(54) GATE-ALL-AROUND DEVICES HAVING DIFFERENT SPACER THICKNESSES

(71) Applicant: International Business Machines Corporation, Armonk, NY (US)

(72) Inventors: Huimei Zhou, Albany, NY (US); Miaomiao Wang, Albany, NY (US); Nicolas Jean Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 714 days.

(21) Appl. No.: 17/845,402

(22) Filed: Jun. 21, 2022

(65) Prior Publication Data

US 2023/0411392 A1 Dec. 21, 2023

(51) Int. Cl.

| | |
|---|---|
| ***H10D 84/85*** | (2025.01) |
| ***H10D 30/01*** | (2025.01) |
| ***H10D 30/67*** | (2025.01) |
| ***H10D 62/10*** | (2025.01) |
| ***H10D 64/01*** | (2025.01) |

(Continued)

(52) U.S. Cl.

CPC ......... *H10D 84/856* (2025.01); *H10D 30/031* (2025.01); *H10D 30/6729* (2025.01); *H10D 30/6735* (2025.01); *H10D 30/6757* (2025.01); *H10D 62/118* (2025.01); *H10D 64/017* (2025.01); *H10D 64/018* (2025.01); *H10D 64/679* (2025.01); *H10D 84/0167* (2025.01); *H10D 84/0184* (2025.01); *H10D 84/0186* (2025.01); *H10D 84/038* (2025.01); *H10P 14/3452* (2026.01)

(58) Field of Classification Search

CPC ............... H10D 84/856; H10D 30/031; H10D 30/6729; H10D 30/6735; H10D 30/6757; H10D 62/118; H10D 64/017; H10D 64/018; H10D 64/679; H10D 84/0167; H10D 84/0184; H10D 84/0186; H10D 84/038; H01L 21/0259

See application file for complete search history.

(56) References Cited

U.S. PATENT DOCUMENTS 9,799,748 B1 * 10/2017 Xie ...................... H10D 30/014
2017/0200738 A1 * 7/2017 Kim ..................... H10D 30/014

(Continued)

OTHER PUBLICATIONS

Veloso, A., et al., "Nanowire & Nanosheet Fets for Advanced Ultra-Scaled, High-Density Logic and Memory Application", IEEE Jun. 2020, pp. 1-4, China Semiconductor Technology International Conference (CSTIC).

(Continued)

*Primary Examiner* — Jay C Kim
*Assistant Examiner* — Woo K Lee
(74) *Attorney, Agent, or Firm* — Scully, Scott, Murphy & Presser, P.C.; Kimberly Zillig

(57) ABSTRACT

A semiconductor structure including a gate-all-around input/output (I/O) device and a gate-all-around core logic device integrated on a semiconductor substrate is provided. The gate-all-around I/O device, which has a wider channel length than the gate-all-around core logic device, has a dielectric spacer and/or inner spacers that is (are) laterally wider (i.e., thicker) than a dielectric spacer and/or inner spacers present in the gate-all-around core logic device.

20 Claims, 13 Drawing Sheets

(51) Int. Cl.

| | |
|---|---|
| ***H10D 64/66*** | (2025.01) |
| ***H10D 84/01*** | (2026.01) |
| ***H10D 84/03*** | (2025.01) |
| ***H10P 14/20*** | (2026.01) |

(56) References Cited

U.S. PATENT DOCUMENTS

| | | | | |
|---|---|---|---|---|
| 2020/0066839 | A1* | 2/2020 | Zhang .................. | H10D 62/121 |
| 2021/0020741 | A1* | 1/2021 | Wu ...................... | H10D 64/015 |
| 2021/0408259 | A1 | 12/2021 | Cheng | |
| 2022/0013523 | A1 | 1/2022 | Cheng | |
| 2022/0328648 | A1* | 10/2022 | Wong ................... | H10D 64/017 |

OTHER PUBLICATIONS

Czornomaz, L., "Hybrid InGaAs/SiGe technology platform for CMOS applications", Mar. 2016, 196 pages, Doctoral dissertation, Université Grenoble Alpes.

Loubet, N., et al., "A Novel Dry Selective Etch of SiGe for the Enablement of High Performance Logic Stacked Gate-All-Around NanoSheet Devices", IEEE International Electron Devices Meeting (IEDM) , Dec. 2019, 5 pages.

Jan C. H., et al.,"45nm low power system-on-chip technology with dual gate (logic and I/O) high-k/metal gate strained silicon transistors", IEEE International Electron Devices Meeting, Dec. 2008, 4 pages.

Prasad, M. S., "A holistic study of on-chip interconnect technology: From modeling theory to physical design of semiconductor ICS", Doctoral dissertation, Georgia Institute of Technology, Aug. 2018, 157 pages.

* cited by examiner

GATE-ALL-AROUND DEVICES HAVING DIFFERENT SPACER THICKNESSES

BACKGROUND

The present application relates to semiconductor technology, and more particularly to a semiconductor structure including a gate-all-around input/output (I/O) device and a gate-all-around core logic device integrated on a semiconductor substrate.

As semiconductor devices scale to smaller dimensions, gate-all-around devices such as nanosheet devices provide advantages. For example, gate-all-around devices provide area efficiency and increased drive current within a given layout area. One example of a gate-all-around device is a nanosheet field effect transistor (FET). Nanosheet FETs are becoming increasingly pursued as a viable semiconductor device option, especially for transistors at smaller scales, e.g., at five nanometer technology (nm) and technologies with even smaller scales. A nanosheet FET typically includes a semiconductor substrate, a number of vertically stacked nanosheets forming a channel, and a functional gate structure. A nanosheet is formed of a thin layer of semiconductor channel material having a vertical thickness that is typically less than a lateral width of the material.

Such gate-all-around devices are important for I/O devices and core logic devices. Core logic devices are designed with a minimum channel length and gate dielectric thickness to achieve best performance. In advanced technologies, the channel length and gate dielectric thickness are too small to withstand operating voltage or transients due to static discharge even with protection circuits. I/O devices are typically designed with a larger channel length and gate dielectric thickness than core logic devices. Integration of gate-all-around core logic devices and gate-all-around I/O devices on a common semiconductor substrate is problematic due to the different needs for both types of devices.

SUMMARY

A semiconductor structure including a gate-all-around I/O device and a gate-all-around core logic device integrated on a semiconductor substrate is provided. The gate-all-around I/O device, which has a wider channel length than the gate-all-around core logic device, has a dielectric spacer and/or inner spacers that is (are) laterally wider (i.e., thicker) than a dielectric spacer and/or inner spacers present in the gate-all-around core logic device. The I/O device can be located in a same plane as, or vertically to (i.e. stacked), the core logic device.

In one aspect of the present application, a semiconductor structure is provided. In one embodiment of the present application, the semiconductor structure includes an I/O device region including a first dielectric spacer and first inner spacers. The first dielectric spacer separates a first source/drain contact and an upper portion of a first gate region, and the first inner spacers are located between a first vertical stack of nanosheets and separate a first source/drain region from a lower portion of the first gate region. The semiconductor structure further includes a core logic device region including a second dielectric spacer and second inner spacers. The second dielectric spacer separates a second source/drain contact and an upper portion of a second gate region, and the second inner spacers are located between a second vertical stack of nanosheets and separate a second source/drain region from a lower portion of the second gate region. In accordance with this embodiment of the present application, the first inner spacers in the I/O device region are laterally wider than the second inner spacers in the core logic device region.

In another embodiment of the present application, the semiconductor structure includes an I/O device region including a first dielectric spacer and first inner spacers. The first dielectric spacer separates a first source/drain contact and an upper portion of a first gate region, and the first inner spacers are located between a first vertical stack of nanosheets and separate a first source/drain region from a lower portion of the first gate region. The semiconductor structure further includes a core logic device region including a second dielectric spacer and second inner spacers. The second dielectric spacer separates a second source/drain contact and an upper portion of a second gate region, and the second inner spacers are located between a second vertical stack of nanosheets and separate a second source/drain region from a lower portion of the second gate region. In accordance with this embodiment of the present application, the first dielectric spacer in the I/O device region is laterally wider than the second dielectric spacer in the core logic device region.

In another aspect of the present application, methods of forming a semiconductor structure are provided. The methods of the present application will be described in greater detail hereinbelow.

DETAILED DESCRIPTION

Figure 1B:
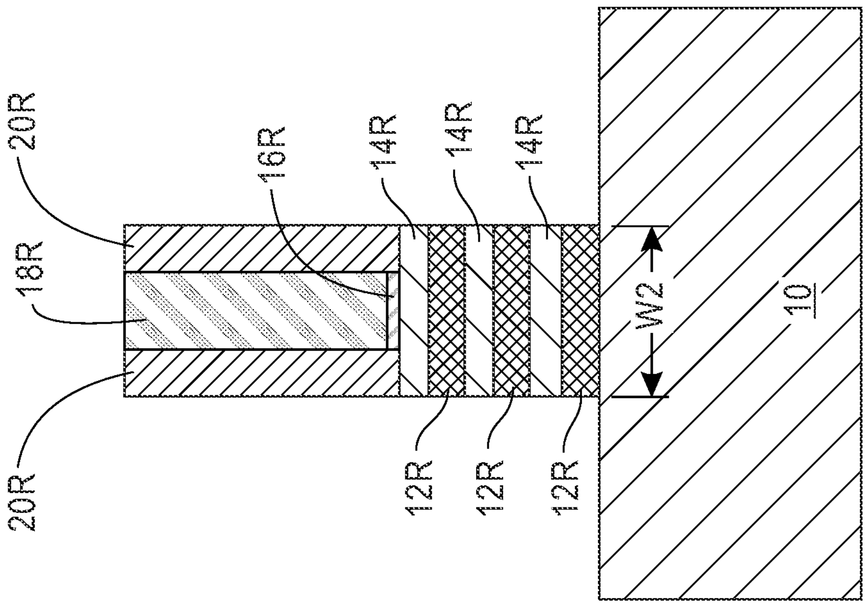
FIG. 1B is a cross sectional view of an initial structure in a core logic device region that can be employed in fabricating a gate-all-around core logic device in accordance with an embodiment of the present application, the initial structure in the core logic device region includes a second material stack of alternating nanosheets of a second sacrificial semiconductor material and a second semiconductor channel material, a second sacrificial gate structure located on, and straddling over, the second material stack, and a second dielectric spacer located laterally adjacent to the second sacrificial gate structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being “on” or “over” another element, it can be directly on the other element or intervening elements may also be present. In contrast, when an element is referred to as being “directly on” or “directly over” another element, there are no intervening elements present. It will also be understood that when an element is referred to as being “beneath” or “under” another element, it can be directly beneath or under the other element, or intervening elements may be present. In contrast, when an element is referred to as being "directly beneath" or "directly under" another element, there are no intervening elements present.

The present application provides a semiconductor structure including a gate-all-around I/O device and a gate-all-around core logic device integrated on a semiconductor substrate. The gate-all-around I/O device, which has a wider channel length than the gate-all-around core logic device, has a dielectric spacer and/or inner spacers that is (are) laterally wider (i.e., thicker) than a dielectric spacer and/or inner spacers present in the gate-all-around core logic device. Such a structure has improved reliability as compared to a prior art structure without the dielectric spacer and/or inner spacer thickness variability. In the present application, the I/O device can be located in a same plane as, or vertically to, the core logic device.

FIGS. 1A-7B illustrate one method of forming a semiconductor structure in accordance with an embodiment of the present application. Notably, a semiconductor structure is provided that includes an I/O device region (shown, for example, in FIG. 7A) including a first dielectric spacer 20L and first inner spacers 26L. The first dielectric spacer 20 separates a first source/drain contact 36L and an upper portion of a first gate region 32/34L, and the first inner spacers 26L are located between a first vertical stack of nanosheets (i.e., first semiconductor material nanosheets 14L) and separating a first source/drain region 28L from a lower portion of the first gate region 32/34L. The semiconductor structure further includes a core logic device region (shown, for example, in FIG. 7B) including a second dielectric spacer 20R and second inner spacers 26R. The second dielectric spacer 20R separates a second source/drain contact 36R and an upper portion of a second gate region 32R/34R, and the second inner spacers 26R are located between a second vertical stack of nanosheets (i.e., second semiconductor channel material nanosheets 14R) and separating a second source/drain region 28R from a lower portion of the second gate region 32R/34R. In accordance with the present application, the first inner spacers 26L are laterally wider than the second inner spacers 26R. In embodiments, the first dielectric spacer 20L can be laterally wider than the second dielectric spacer 20R. In embodiments, the first source/drain region 28L, the second source/drain region 28R, a bottommost portion of the first gate region, and a bottommost portion of the second gate region are each in direct physical contact with semiconductor substrate 10. In other embodiments, a dielectric material layer can be positioned between each of the first source/drain region 28L, the second source/drain region 28R, a bottommost portion of the first gate region, and a bottommost portion of the second gate region and the semiconductor substrate 10.

Figure 1A:
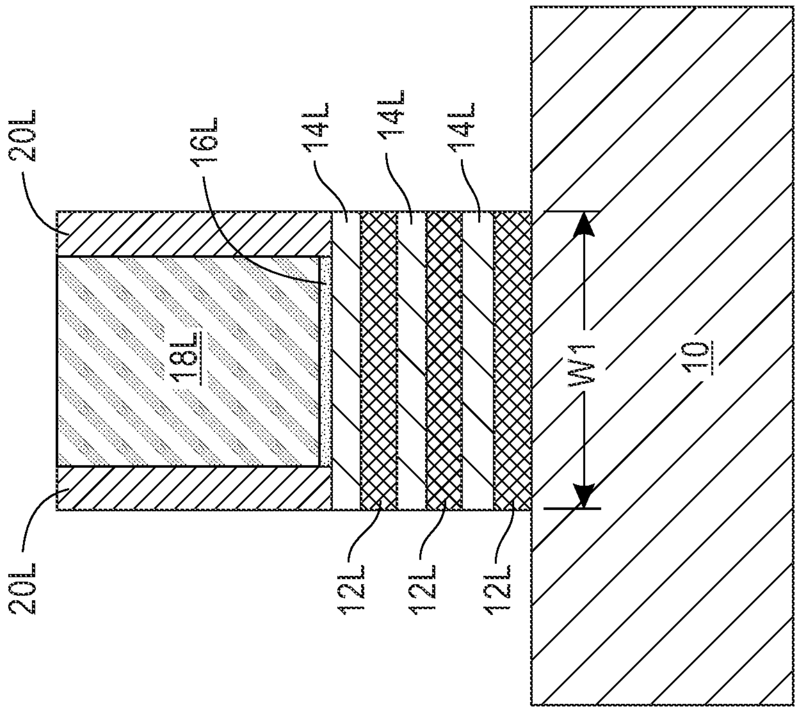
FIG. 1A is a cross sectional view of an initial structure in an I/O device region that can be employed in fabricating a gate-all-around I/O device in accordance with an embodiment of the present application, the initial structure in the I/O device region includes a first material stack of alternating nanosheets of a first sacrificial semiconductor material and a first semiconductor channel material, a first sacrificial gate structure located on, and straddling over, the first material stack, and a first dielectric spacer located laterally adjacent to the first sacrificial gate structure.

Reference is first made to FIGS. 1A-1B which are cross sectional views of an initial structure in an I/O device region (FIG. 1A) and an initial structure in a core logic device region (FIG. 1B) that can be employed in the present application in fabricating a gate-all-around I/O device and a gate-all-around core logic device integrated on a same semiconductor substrate. It is noted that the initial structures shown in FIGS. 1A-1B (and the structures in FIGS. 2A-2B, 3A-3B, 4A-4B, . . . 13A-13B) are not located on different semiconductor substrates, but rather the initial structures shown in FIGS. 1A-1B (and the structures in FIGS. 2A-2B, 3A-3B, 4A-4B, . . . 13A-13B) are located in different portions (i.e., a first portion for the I/O device and a second portion for the core logic device) of a common semiconductor substrate. In the present application, the I/O device region can be located in the same plane as, or located vertically to, the core logic device region.

Notably, the initial structure in the I/O device region and as illustrated in FIG. 1A includes a first material stack of alternating nanosheets of a first sacrificial semiconductor material (i.e., first sacrificial semiconductor material nanosheet 12L) and a first semiconductor channel material (i.e., first semiconductor channel material nanosheet 14L), a first sacrificial gate structure 16/18L located on, and straddling over, the first material stack, and a first dielectric spacer 20L located laterally adjacent to the first sacrificial gate structure 16L/18L. The first material stack shown in FIG. 1A is located on a first portion of semiconductor substrate 10.

The initial structure in the core logic device region and as is illustrated in FIG. 1B includes a second material stack of alternating nanosheets of a second sacrificial semiconductor material (i.e., second sacrificial semiconductor material nanosheet 12R) and a second semiconductor channel material (i.e., second semiconductor channel material nanosheet 14R), a second sacrificial gate structure 16R/18R located on, and straddling over, the second material stack, and a second dielectric spacer 20R located laterally adjacent to the second sacrificial gate structure 16R/18R. The second material stack shown in FIG. 1B is located on a second portion of semiconductor substrate 10. In the illustrated embodiment, the first and second portions of the semiconductor substrate 10 are located adjacent to each other and can be separated by one or more other devices and/or dielectric isolation structures that can be formed into the semiconductor substrate 10.

The semiconductor substrate 10 is composed of a semiconductor material that has semiconducting properties (i.e., a semiconductor material). Illustrative examples of semiconductor materials that can be used as the semiconductor substrate 10 include, but are not limited to, silicon (Si), germanium (Ge), a silicon germanium (SiGe) alloy, silicon carbide (SiC), silicon germanium carbide (SiGeC), a III-V compound semiconductor or an II-VI compound semiconductor. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

In embodiments of the present application, semiconductor substrate 10 is a bulk semiconductor substrate that is composed entirely of at least one of the semiconductor materials mentioned above. For example, a bulk silicon substrate can be used as the semiconductor substrate 10. In other embodiments, semiconductor substrate 10 is a semiconductor-on-insulator (SOI) substrate including, from bottom to top, a handle substrate (typically a semiconductor material), a buried dielectric material (typically silicon dioxide and/or boron nitride) and a top semiconductor device layer. In one example, a silicon/silicon dioxide/silicon SOI substrate can be used as semiconductor substrate 10.

As mentioned above, the first material stack includes alternating nanosheets of a first sacrificial semiconductor material (i.e., first sacrificial semiconductor material nanosheet 12L) and a first semiconductor channel material (i.e., first semiconductor channel material nanosheet 14L) stacked one atop the other. In the present application, the first material stack includes 'n' number of first sacrificial semiconductor material nanosheets 12L and 'n' number of first semiconductor channel material nanosheets 14L wherein n is an integer starting at one. By way of one example, and as is illustrated in FIG. 1A, the first material stack includes three first sacrificial semiconductor material nanosheets 12L and three first semiconductor channel material nanosheets 14L.

Each first sacrificial semiconductor material nanosheet 12L is composed of a first semiconductor material, while each first semiconductor channel material nanosheet 14L is composed of a second semiconductor material that is compositionally different from the first semiconductor material. In some embodiments, the second semiconductor material that provides each first semiconductor channel material nanosheet 14L is a semiconductor material that is capable of providing high channel mobility for n-type FET devices. In other embodiments, the second semiconductor material that provides each first semiconductor channel material nanosheet 14L is a semiconductor material that is capable of providing high channel mobility for p-type FET devices.

The first semiconductor material that provides each first sacrificial semiconductor material nanosheet 12L, and the second semiconductor material that provides each first semiconductor channel material layer 14L can include one of the semiconductor materials mentioned above for the semiconductor substrate 10. In the present application, the first semiconductor material that provides each first sacrificial semiconductor material nanosheet 12L can be compositionally the same as, or compositionally different from, at least an uppermost semiconductor material portion of the semiconductor substrate 10. Typically, the second semiconductor material that provides each first semiconductor channel material nanosheet 14L is compositionally the same as at least the uppermost semiconductor material portion of the semiconductor substrate 10. In one example, the semiconductor substrate 10 is composed of silicon, the first semiconductor material that provides each first sacrificial semiconductor material nanosheet 12L is composed of a silicon germanium alloy, and the second semiconductor material that provides each first semiconductor channel material nanosheet 14L is composed of silicon. Other combinations of semiconductor materials are possible as long as the first semiconductor material that provides each first sacrificial semiconductor material layer 12L is compositionally different from the second semiconductor material that provides each first semiconductor channel material nanosheet 14L.

As mentioned above, the second material stack includes alternating nanosheets of a second sacrificial semiconductor material (i.e., second sacrificial semiconductor material nanosheet 12R) and a second semiconductor channel material (i.e., second semiconductor channel material nanosheet 14R) stacked one atop the other. In the present application, the second material stack includes 'm' number of second sacrificial semiconductor material nanosheets 12R and 'm' number of second semiconductor channel material nanosheets 14R wherein m is an integer starting at one. By way of one example, and as is illustrated in FIG. 1B, the second material stack includes three second sacrificial semiconductor material nanosheets 12R and three second semiconductor channel material nanosheets 14R. In the present application, the first material stack typically has a same height as the second material stack. In other embodiments, one of the material stacks of the first material stack and the second material stack can have a different height than the other material stack.

Each second sacrificial semiconductor material nanosheet 12R is composed of a third semiconductor material, while each second semiconductor channel material nanosheet 14R is composed of a fourth semiconductor material that is compositionally different from the third semiconductor material. In some embodiments, the fourth semiconductor material that provides each second semiconductor channel material nanosheet 14R is a semiconductor material that is capable of providing high channel mobility for n-type FET devices. In other embodiments, the fourth semiconductor material that provides each second semiconductor channel material nanosheet 14R is a semiconductor material that is capable of providing high channel mobility for p-type FET devices.

The third semiconductor material that provides each second sacrificial semiconductor material nanosheet 12R, and the fourth semiconductor material that provides each second semiconductor channel material nanosheet 14R can include one of the semiconductor materials mentioned above for the semiconductor substrate 10. In the present application, the third semiconductor material that provides each second sacrificial semiconductor material nanosheet 12R can be compositionally the same as, or compositionally different from, at least an uppermost semiconductor material portion of the semiconductor substrate 10. Typically, the fourth semiconductor material that provides each second semiconductor channel material nanosheet 14R is compositionally the same as at least the uppermost semiconductor material portion of the semiconductor substrate 10. In one example, the semiconductor substrate 10 is composed of silicon, the third semiconductor material that provides each second sacrificial semiconductor material nanosheet 12R is composed of a silicon germanium alloy, and the fourth semiconductor material that provides each second semiconductor channel material nanosheet 14R is composed of silicon. Other combinations of semiconductor materials are possible as long as the third semiconductor material that provides each second sacrificial semiconductor material nanosheet 12R is compositionally different from the fourth semiconductor material that provides each second semiconductor channel material nanosheet 14R.

In embodiments of the present application, the first semiconductor material that provides each first sacrificial semiconductor material nanosheet 12L and the third semiconductor material that provides each second sacrificial semiconductor material nanosheet 12R are compositionally the same semiconductor material. In other embodiments of the present application, the first semiconductor material that provides each first sacrificial semiconductor material nanosheet 12L and the third semiconductor material that provides each second sacrificial semiconductor material nanosheet 12R are compositionally different from each other.

In embodiments of the present application, the second semiconductor material that provides each first semiconductor channel material nanosheet 14L and the fourth semiconductor material that provides each second semiconductor channel material nanosheet 14R are compositionally the same semiconductor material. In other embodiments of the present application, the second semiconductor material that provides each first semiconductor channel material nanosheet 14L and the fourth semiconductor material that provides each second semiconductor channel material nanosheet 14R are compositionally different from each other.

In this illustrated embodiment and as is shown in FIGS. 1A-1B, the first material stack and the second material stack are both located directly atop different portions of the same semiconductor substrate 10. In some embodiments, a dielectric material layer can be positioned between the semiconductor substrate 10 and each of the material stacks (see, for example, the embodiment depicted in FIGS. 8A-12B). This dielectric material layer can effectively limit punch through from short channel length and improve leakage.

As is illustrated in FIGS. 1A-1B, the first material stack including the first sacrificial semiconductor material nanosheets 12L and the first semiconductor channel material nanosheets 14L has a first lateral width, W1, that is greater (i.e., wider) than a second lateral width, W2, of the second material stack including the second sacrificial semiconductor material nanosheets 12R and the second semiconductor channel material nanosheets 14R. Notably, and at this point of the present application, the first sacrificial semiconductor material nanosheets 12L and the first semiconductor channel material nanosheets 14L have a first lateral width, i.e., W1 shown in FIG. 1A, from 25 nm to 200 nm, while the second sacrificial semiconductor material nanosheets 12R and the second semiconductor channel material nanosheets 14R have a second lateral width, i.e., W2 shown in FIG. 1B, from 3 nm to 25 nm, with the proviso that the first lateral width is greater than the second lateral width.

Typically, the first sacrificial semiconductor material nanosheets 12L, the first semiconductor channel material nanosheets 14L, the first semiconductor channel material nanosheets 14L and the second semiconductor channel material nanosheets 14R have a vertical thickness from 1 nm to 15 nm.

The first sacrificial gate structure 16L/18L which is located on, and straddles over, the first material stack, includes a first sacrificial gate dielectric layer 16L and a first sacrificial gate material layer 18L. The first sacrificial gate dielectric layer 16L is composed of a first sacrificial gate dielectric material such as, for example, silicon dioxide, while the first sacrificial gate material layer 18L includes a first sacrificial gate material such as, for example, polysilicon or a metal. The second sacrificial gate structure 16R/18R which is located on, and straddles over, the second material stack, includes a second sacrificial gate dielectric layer 16R and a second sacrificial gate material layer 18R. The second sacrificial gate dielectric layer 16R is composed of a second sacrificial gate dielectric material such as, for example, silicon dioxide, while the second sacrificial gate material layer 18R includes a second sacrificial gate material such as, for example, polysilicon or a metal. The second sacrificial gate dielectric material that provides the second sacrificial gate dielectric layer 16R can be compositionally the same as, or compositionally different from, the first sacrificial gate dielectric material that provides the first sacrificial gate dielectric layer 16L. The second sacrificial gate material that provides the second sacrificial gate material layer 18R can be compositionally the same as, or compositionally different from, the first sacrificial gate material that provides the first sacrificial gate material layer 18L.

Figure 13B:
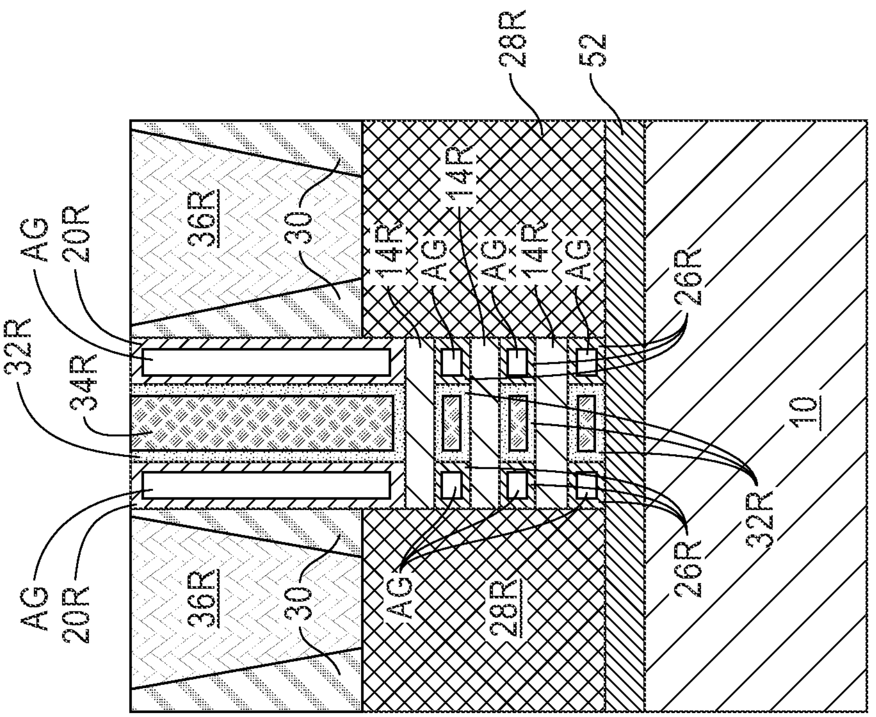
FIG. 13B is a cross view of a gate-all-around core logic device in the core logic device region in accordance with another embodiment of the present application.
Figure 13A:
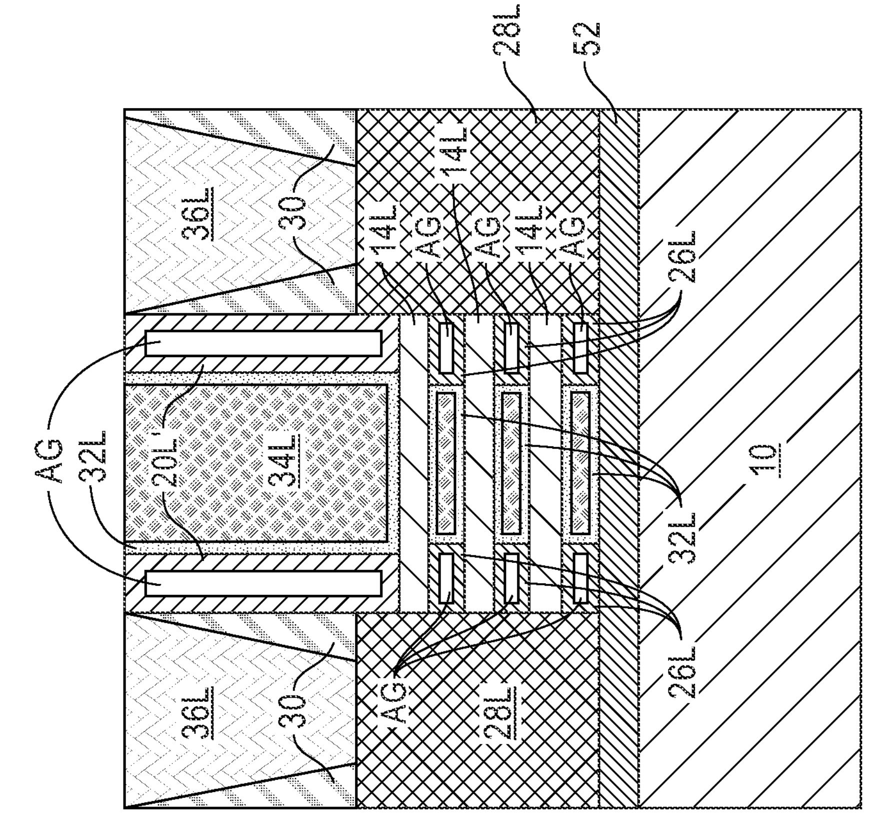
FIG. 13A is a cross view of a gate-all-around I/O device in the I/O device region in accordance with another embodiment of the present application.

The first dielectric spacer 20L which is located laterally adjacent to the first sacrificial gate structure 16L/18L is composed of a first dielectric spacer material such as, for example, silicon dioxide or silicon nitride. The second dielectric spacer 20R which is located laterally adjacent to the second sacrificial gate structure 16R/18R is composed of a second dielectric spacer material such as, for example, silicon dioxide or silicon nitride. The first dielectric spacer material that provides the first dielectric spacer 20L can be compositionally the same as, or compositionally different from, the second dielectric spacer material that provides the second dielectric spacer 20R. In the embodiment depicted in FIGS. 1A-1B, the first dielectric spacer material and the second dielectric spacer material are both solid dielectric materials. In some embodiments, and as depicted in FIGS. 13A-13B, the first dielectric spacer 20L and the second dielectric spacer 20R are both composed of a solid dielectric material and an air gap. In yet other embodiments, the first and second dielectric spacers 20L, 20R are entirely air gap spacers.

The initial structure shown in FIGS. 1A-1B can be formed simultaneously or in separate processing steps. Notably, the first and second material stacks can be formed by growing alternating blanket layers of sacrificial semiconductor material and semiconductor channel material on the semiconductor substrate 10. The alternating blanket layers of sacrificial semiconductor material and semiconductor channel material can be deposited utilizing an epitaxial growth process. The alternating blanket layers of sacrificial semiconductor material and semiconductor channel material are then patterned by lithography and etching to form at least one of the material stacks. The etch goes through the alternating blanket layers of sacrificial semiconductor material and semiconductor channel material and into a top portion of the semiconductor substrate 10 forming a shallow trench isolation (STI) trench (not shown) at least between different device regions. The STI trench can then be processed to include an STI dielectric material so as to provide a STI structure (not shown), which in some embodiments, can be located between the different device regions.

Next, at least one of the sacrificial gate structures is formed. The at least one sacrificial gate structure can be formed by depositing blanket layers of a sacrificial gate dielectric material (such as, for example, silicon dioxide), and a sacrificial gate material (such as, for example, polysilicon or a metal). The depositing of the blanket layers of the sacrificial gate material, and sacrificial gate dielectric material includes, but is not limited to, chemical vapor deposition (CVD), plasma enhanced chemical vapor deposition (PECVD), physically vapor deposition (PVD), atomic layer deposition (ALD) or any combination of such deposition processes. After forming the blanket layers of sacrificial gate dielectric material, and sacrificial gate material patterning process (including lithography and etching) is used to convert the blanket layers of the sacrificial gate dielectric material and the sacrificial gate dielectric material into at least one sacrificial gate structure. In some embodiments, the above processing steps are performed to provide the first sacrificial structure 16L, 18L and a precursor second sacrificial gate structure. A second patterning step is then performed to convert the precursor second sacrificial gate structure into the second sacrificial structure 16R/18R. In other embodiments, the above processing steps can be used to provide one of the first sacrificial gate structure 16L/18L or the second sacrificial structure 16R/18R. A block mask can be formed over the particular sacrificial gate structure that is formed, and thereafter the other of the first sacrificial gate structure 16U 18L or the second sacrificial structure 16R/18R not previously formed is formed repeating the above processing steps.

After forming the at least one sacrificial gate structure, the dielectric spacer (i.e., the first dielectric spacer 20L and the second dielectric spacer 20R) is then formed by deposition of a dielectric spacer material, followed by a spacer etch. In some embodiments, the first and second dielectric spacers 20L, 20R are formed simultaneously. In other embodiments, one of the dielectric spacers (e.g., the first dielectric spacer 20L) is formed prior to the other dielectric spacer (e.g., the second dielectric spacer 20R).

Figure 2A:
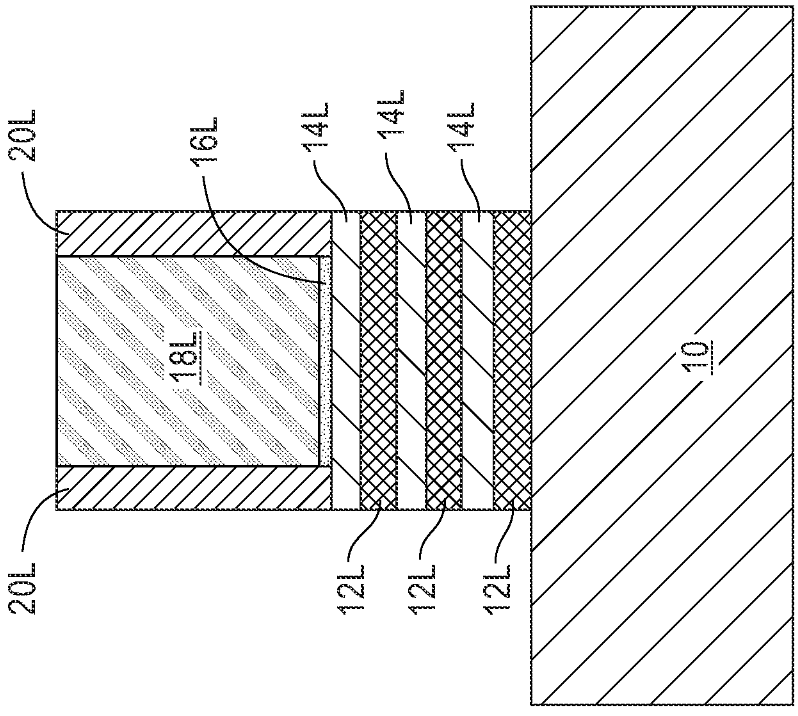
FIG. 2A is a cross sectional view of the initial structure shown in FIG. 1A after forming a mask in the core logic device region.
Figure 2B:
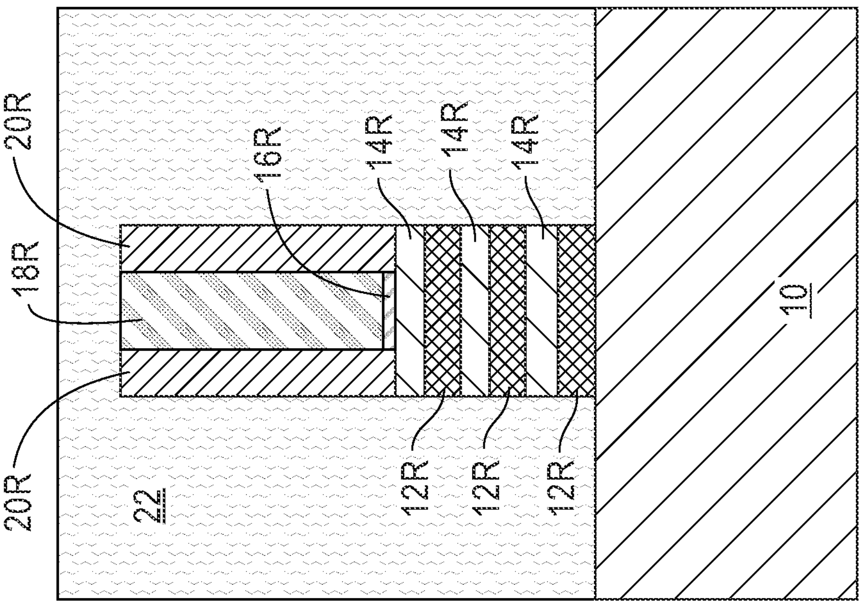
FIG. 2B is a cross sectional view of the initial structure shown in FIG. 1B after forming a mask in the core logic device region.

Referring now to FIGS. 2A-2B, there are illustrated the initial structures shown in FIGS. 1A-1B, respectively, after forming a mask 22 in the core logic device region as is shown in FIG. 1B. The mask 22 is not formed in the I/O device region. The mask 22 can be composed of a photoresist material, a hard mask material including, but not limited to, silicon nitride or silicon oxynitride, or any combination of a photoresist material and at least one hard mask material. The mask 22 can be formed by deposition of the photoresist material and/or the hard mask material, followed by patterning. In some embodiments in which the mask 22 includes a hard mask material, patterning can include lithography and etching. In this embodiment, the core logic device region is masked such that thicker inner spacers can be formed in the I/O device region.

Figure 3A:
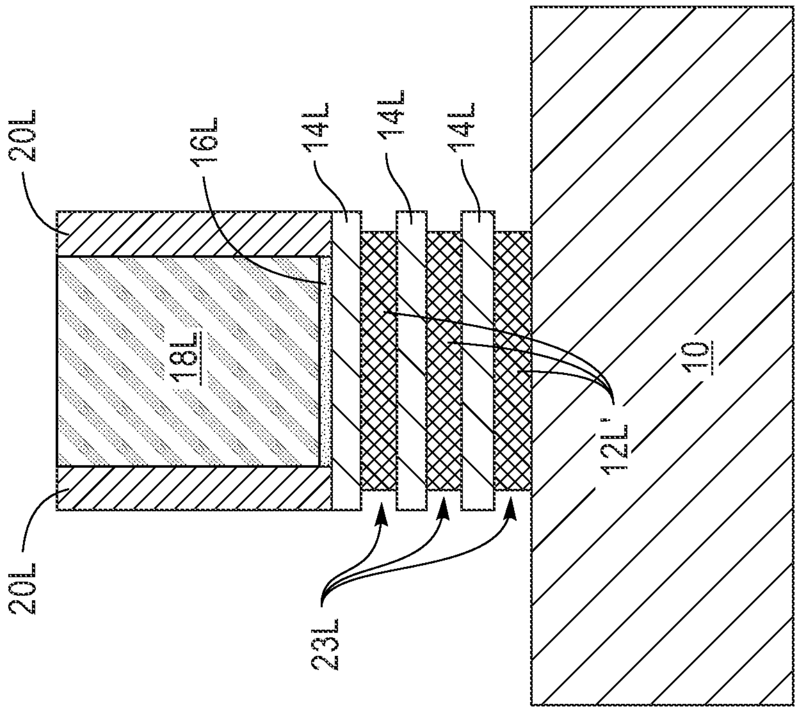
FIG. 3A is a cross sectional view of the structure shown in FIG. 2A after recessing each first sacrificial semiconductor material nanosheet of the first material stack.
Figure 3B:
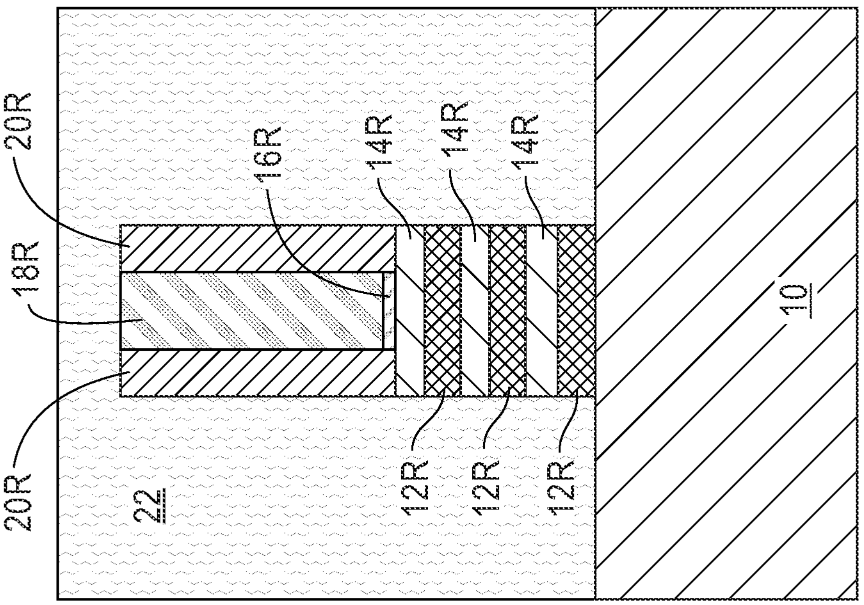
FIG. 3B is a cross sectional view of the structure shown in FIG. 2B after recessing each first sacrificial semiconductor material nanosheet of the first material stack.

Referring now to FIGS. 3A-3B, there are illustrated the structures shown in FIGS. 2A-2B, respectively, after recessing each of the first sacrificial semiconductor material nanosheets 12L of the first material stack; no recessing of the second sacrificial semiconductor material nanosheets 12R of the second material stack occurs at this point of the present application since the mask 22 protects the second material stack during this recessing step. As is shown in FIG. 3A, gaps 23L are formed in the first material stack by the recessing step. After this recessing step, the remaining first sacrificial semiconductor material nanosheets 12L (hereinafter once recessed first sacrificial semiconductor material nanosheets 12L') have a reduced lateral width as compared to the lateral width of the original first sacrificial semiconductor material nanosheets 12L. The recessing includes a lateral etching process that is selective in removing the first sacrificial semiconductor material nanosheets 12L relative to the first semiconductor channel material nanosheets 14L.

Figure 4A:
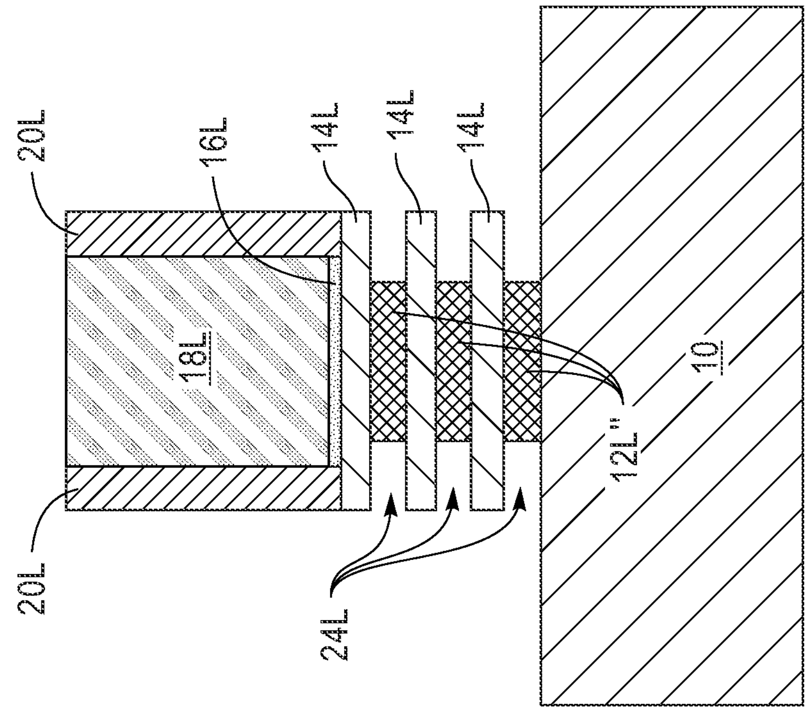
FIG. 4A is a cross sectional view of the structure shown in FIG. 3A after removing the mask from the core logic device region, and recessing each of the previously recessed (i.e., once recessed) first sacrificial semiconductor material nanosheets of the first material stack and each second sacrificial semiconductor material nanosheet of the second material stack, the recessing providing first indentations in the first material stack and second indentations in the second material stack.
Figure 4B:
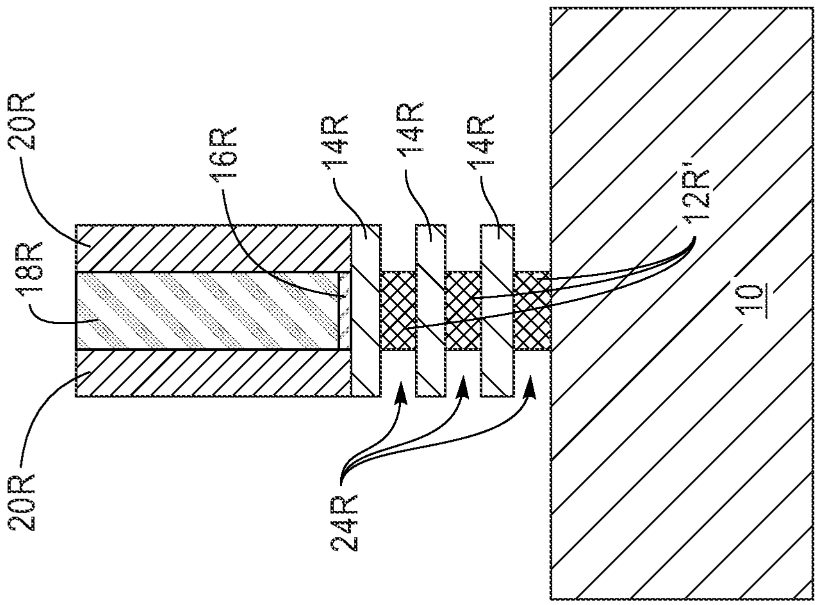
FIG. 4B is a cross sectional view of the structure shown in FIG. 3B after removing the mask from the core logic device region, and recessing each of the previously recessed (i.e., once recessed) first sacrificial semiconductor material nanosheets of the first material stack and each second sacrificial semiconductor material nanosheet of the second material stack, the recessing providing first indentations in the first material stack and second indentations in the second material stack.

Referring now to FIGS. 4A-4B, there are illustrated the structures shown in FIGS. 3A-3B, respectively, after removing the mask 22 from the core logic device region, and recessing each of the once recessed first sacrificial semiconductor material nanosheets 12L' of the first material stack and each of the second sacrificial semiconductor material nanosheets 12R of the second material stack. The recessing provides first indentations (i.e., first inner spacer openings) 24L in the first material stack and second indentations 24R (i.e., second inner spacer openings) in the second material stack. The mask 22 can be removed utilizing any mask removal process such as, for example, etching.

After this recessing step, the remaining once recessed first sacrificial semiconductor material nanosheets 12L' (hereinafter twice recessed sacrificial semiconductor material nanosheets 12L") have a reduced lateral width as compared to the lateral width of the once recessed first sacrificial semiconductor material nanosheets 12L', and the remaining second sacrificial semiconductor material nanosheets 12L (hereinafter once recessed second sacrificial semiconductor material nanosheets 12R') have a reduced lateral width as compared to the lateral width of the original second sacrificial semiconductor material nanosheets 12R. The recessing includes a lateral etching process that is selective in removing the sacrificial semiconductor material nanosheets relative to the semiconductor channel material nanosheets. As is evident from FIGS. 4A-4B, the first indentations 24L have a first lateral width that is wider than a second lateral width of the first indentations 24R. This allows for forming inner spacers in the respective device regions having different lateral widths. A single recess etch can be performed to provide the structure shown FIGS. 4A-4B, or, in some instances, multiple recess etching steps can be performed to provide the structure shown in FIGS. 4A-4B.

Figure 5A:
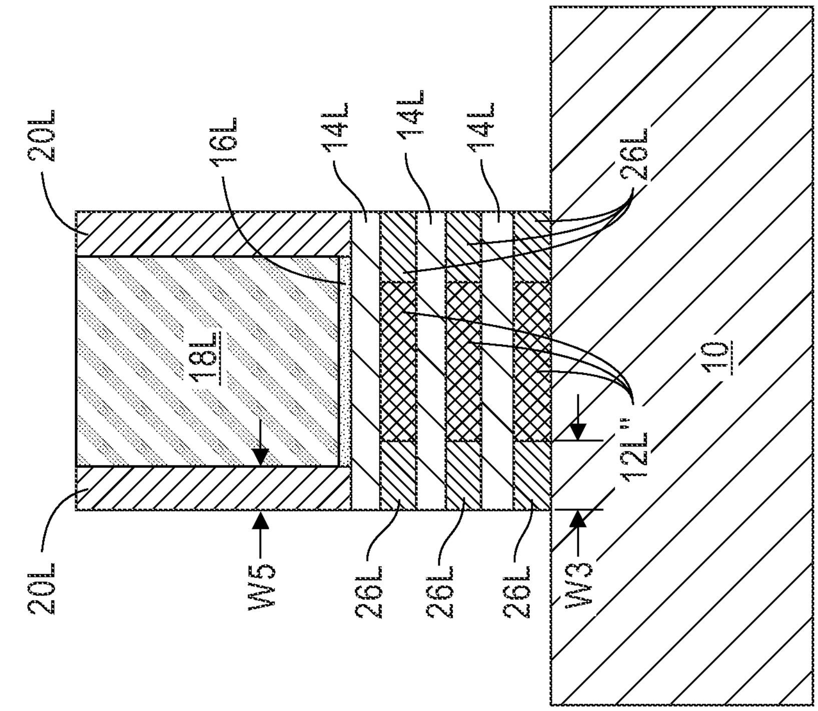
FIG. 5A is a cross sectional view of the structure shown in FIG. 4A after forming a first inner spacer within each of the first indentations, and forming a second inner spacer within each of the second indentations.
Figure 5B:
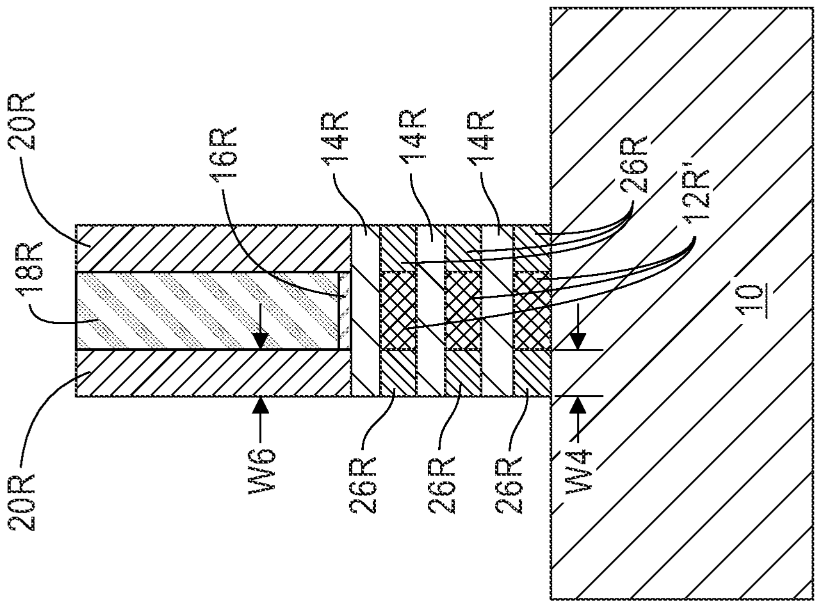
FIG. 5B is a cross sectional view of the structure shown in FIG. 4B after forming a first inner spacer within each of the first indentations, and forming a second inner spacer within each of the second indentations.

Referring now to FIGS. 5A-5B, there are illustrated the structures shown in FIGS. 4A-4B, respectively, after forming a first inner spacer 26L within each of the first indentations 24L, and forming a second inner spacer 26R within each of the second indentations 24R.

Each first inner spacer 26L is composed of a first inner spacer dielectric material such as, for example, silicon dioxide or silicon nitride, and each second inner spacer 26R is composed of a second inner spacer dielectric material such as, for example, silicon dioxide or silicon nitride, which can be compositionally the same as, or compositionally different from, the first inner spacer dielectric material. The first inner spacer dielectric material that provides the first inner spacers 26L can be compositionally the same as, or compositionally different from the first spacer dielectric that provides the first dielectric spacer 20L. Likewise, the second inner spacer dielectric material that provides the second inner spacers 26R can be compositionally the same as, or compositionally different from the second spacer dielectric that provides the second dielectric spacer 20R. The forming of the first inner spacer 26L and the second inner spacer 26R includes conformal deposition of an inner spacer dielectric material, followed by an isotropic etching.

As is shown in FIGS. 5A-5B, each first inner spacer 26L has a first lateral width, W3, that is wider than a second lateral width, W4, of each second inner spacer 26R. Also, and as is shown in FIGS. 5A-5B, the first lateral width, W3, of each first inner spacer 26L is typically wider than the first lateral width, W5, of the first dielectric spacer 20L, while the second lateral width, W4, of each second inner spacer 26L can be substantially the same (within ±10%) as the second lateral width, W6, of the second dielectric spacer 20L. In some embodiments, W3 can be substantially the same as W5. In one example, W3 is from 10 nm to 30 nm, W4 is from 3 nm to 10 nm, W5 is from 3 nm to 10 nm, and W6 is from 3 nm to 10 nm. Each first inner spacer 26L has a same lateral width, and each second inner spacer 26R has a same laterally width.

It is noted that when the first sacrificial semiconductor material nanosheets 12L and the second sacrificial semiconductor material nanosheets 12R are composed of different semiconductor materials, it is possible to replace the processing shown in FIGS. 2A, 2B, 3A, 3B. 4A and 4B with a single recess etch which provides the unequally etched first and second sacrificial semiconductor nanosheets.

Figure 6B:
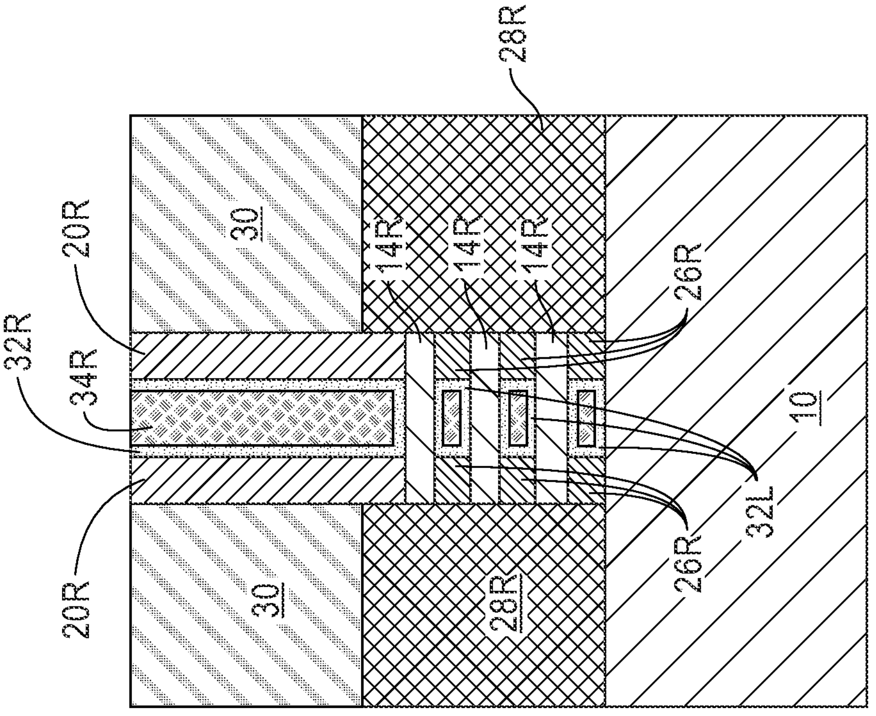
FIG. 6B is a cross sectional view of the structure shown in FIG. 5B after further device processing including forming a second source/drain region, forming an interlayer dielectric material layer, removing the second sacrificial gate structure, suspending each second semiconductor channel material nanosheet by removing each of the recessed second sacrificial semiconductor material nanosheets, and forming a second gate region in the area previously occupied by the second sacrificial gate structure and each of the recessed second sacrificial semiconductor material nanosheets.
Figure 6A:
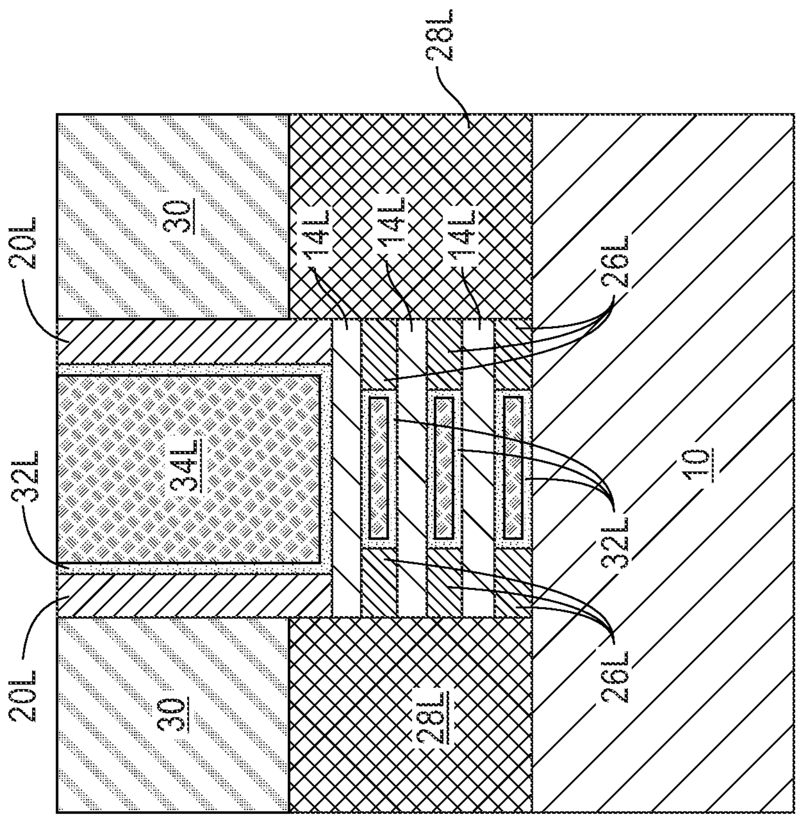
FIG. 6A is a cross sectional view of the structure shown in FIG. 5A after further device processing including forming a first source/drain region, forming an interlayer dielectric material layer, removing the first sacrificial gate structure, suspending each first semiconductor channel material nanosheet by removing each of the twice recessed first sacrificial semiconductor material nanosheets, and forming a first gate region in the area previously occupied by the first sacrificial gate structure and each of the twice recessed first sacrificial semiconductor material nanosheets.

Referring now to FIGS. 6A-6B, there are illustrated the structures shown in FIGS. 5A-5B, respectively, after further device processing including forming a first source/drain region 28L, forming an interlayer dielectric material layer 30, removing the first sacrificial gate structure 16L/18L, suspending each first semiconductor channel material 14L by removing each of the twice recessed first sacrificial semiconductor material nanosheets 12L", and forming a first gate region 32L/34L (i.e., first functional gate structure) in the area previously occupied by the first sacrificial gate structure 16L/18L and each of the twice recessed first sacrificial semiconductor material nanosheets 12L" and forming a second source/drain region 28R, forming interlayer dielectric material layer 30, removing the second sacrificial gate structure 16R/18R, suspending each of the second semiconductor channel material nanosheets 14R by removing each of the recessed second sacrificial semiconductor material nanosheets 12R', and forming a second gate region 32R/34R (second functional gate structure) in the area previously occupied by the second sacrificial gate structure 16R/18R and each of the recessed second sacrificial semiconductor material nanosheets 12R'. As is shown in FIG. 6A, the first source/drain region 28L extends outward from sidewalls of each of the first semiconductor channel material nanosheets 14L, while the second source/drain region 28R extends outward from sidewalls of each of the second semiconductor channel material nanosheets 14R. In this illustrated embodiment, the first source/drain region 28L has a surface in direct physical contact with a first portion of the semiconductor substrate 10, and the second source/drain region 28R has a surface in direct physical contact with a second portion of the semiconductor substrate 10.

The first source/drain region 28L and the second source/drain region 28R are both formed by an epitaxial growth process, and thus in this illustrated embodiment each of the first source/drain region 28L and the second source/drain region 28R has a same crystal orientation as the growth surface of the semiconductor substrate 10. A dopant, as defined below, is typically present during the epitaxial growth process or afterwards implant. A recess etch can be optionally employed so as to reduce the height of each of the first and second source/drain regions 28L, 28R. The first source/drain region 28L can be formed before, in conjunction with, or after the second source/drain region 28R. As used herein, a "source/drain" region can be a source region or a drain region depending on subsequent wiring and application of voltages during operation of the FET. Each of the first source/drain region and the second source/drain region comprises a semiconductor material and a dopant. The semiconductor material that provides each of the first source/drain region 28L and the second source/drain region 28R can include one of the semiconductor materials mentioned above for the semiconductor substrate 10. The semiconductor material that provides the each of the source/drain regions can be compositionally the same, or compositionally different from each semiconductor channel material nanosheet that is present in the respective device region.

The dopant that is present in each of the first source/drain region 28L and the second source/drain region 28R can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each of the first source/drain region 28L and the second source/drain region 28R can have a dopant concentration of from $4\times10^{19}$ atoms/$cm^3$ to $3\times10^{22}$ atoms/$cm^3$.

The interlayer dielectric (ILD) material layer 30 is formed atop each of the first source/drain region 28L and the second source/drain region 28R. The ILD material layer 30 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted). Although not shown, the ILD material layer 30 can include a multilayered structure that includes at least two different dielectric materials stacked one atop the other such as, for example, silicon nitride and silicon dioxide. The ILD material layer 30 can be formed by a deposition process such as, for example, CVD, PECVD, or spin-on coating. A planarization process can be performed after the deposition of the dielectric material that provides the ILD material layer 30. Each of the first sacrificial gate structure 16L/18L and the second sacrificial gate structure 16R/18R are then removed to reveal the first material stack and the second material stack, respectively.

The removal of the first sacrificial gate structure 16L/18L and the second sacrificial gate structure 16R/18R can include one or more etching processes that are selective in removing the first sacrificial gate structure 16L/18L and the second sacrificial gate structure 16R/18R. The removal of the first sacrificial gate structure can be performed at the same time as, or at a different time than the removal of the second sacrificial gate structure. After removing the sacrificial gate structure, the twice recessed first sacrificial semiconductor material nanosheets 12L" and the once recessed second sacrificial semiconductor material nanosheets 12R' are removed utilizing an etch that is selective in removing the sacrificial semiconductor material relative to the semiconductor channel material that provides the respective semiconductor channel material nanosheets in each of the device regions. For example, an etch can be used to selectively remove SiGe sacrificial semiconductor material nanosheets relative to Si semiconductor channel material nanosheets. Each first semiconductor channel material nanosheet 14L and each second semiconductor channel material nanosheet 14R are now suspended semiconductor channel material nanosheets.

The first gate region includes at least a first gate dielectric material layer 32L and a first gate electrode 34L, and the second gate region includes at least a second gate dielectric material layer 32R and a second gate electrode 34R. As is shown in FIG. 6A, the first gate region wraps around each first semiconductor channel material nanosheet 14L and is present laterally adjacent to the first dielectric spacer 20L and the first inner spacers 26L. Likewise and as is shown in FIG. 6B, the second gate region wraps around each second semiconductor channel material nanosheet 14R and is present laterally adjacent to the second dielectric spacer 20R and the second inner spacers 26R. As is known, the gate dielectric material layer of each gate region is in direct contact with a physically exposed portion of each semiconductor channel material nanosheet within the respective device region, and the gate electrode is located on the gate dielectric material layer. In some embodiments, the functional gate structure includes a work function metal (WFM) layer (not shown) located between the gate dielectric material layer and the gate electrode.

Each of the first and second gate regions can be forming a continuous layer of gate dielectric material and a gate electrode material inside and outside gate cavity that is formed by removing the sacrificial gate structure and the recessed sacrificial semiconductor nanosheets. The continuous layer of gate dielectric material can include silicon oxide, or a dielectric material having a dielectric constant greater than 4.0 (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SfTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide (Pb$(Sc,Ta)O_3$), and/or lead zinc niobite (Pb(Zn,Nb)O). The high-k gate dielectric material can further include dopants such as lanthanum (La), aluminum (Al) and/or magnesium (Mg). The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_X$), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM (work function metal) can be formed on the continuous layer of gate dielectric material prior to forming the gate electrode material. In other embodiments, the gate electrode is composed of only a WFM. The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, chemical mechanical polishing (CMP), is used to remove the continuous layer of the gate dielectric material, the optional layer of WFM and the gate electrode material from outside the gate cavity. The remaining continuous layer of the gate dielectric material that is present inside the gate cavity can be referred to as a gate dielectric material layer, the remaining optional layer of WFM that is present inside the gate cavity can be referred to a WFM layer, and remaining gate electrode material that is present inside the gate cavity provides a gate electrode.

In the present application, the first gate dielectric material layer 32L and the second gate dielectric material layer 32R include one of the gate dielectric materials mentioned above. The first gate dielectric material layer 32L has thickness that is greater than a thickness of the second gate dielectric material layer 32R. The gate dielectric material that provides the first gate dielectric material layer 32L can be compositionally the same as, or compositionally different from, the gate dielectric material that provides the second gate dielectric material layer 32R. The first gate electrode 34L and the second gate electrode 34R include one of the gate electrode materials mentioned above. The gate electrode material that provides the first electrode 34L can be compositionally the same as, or compositionally different from, the gate electrode material that provides the second gate electrode 34R. As is illustrated in FIGS. 6A-6B, the first gate region has a first channel length that is laterally wider than the second channel length of the second gate region.

Figure 7B:
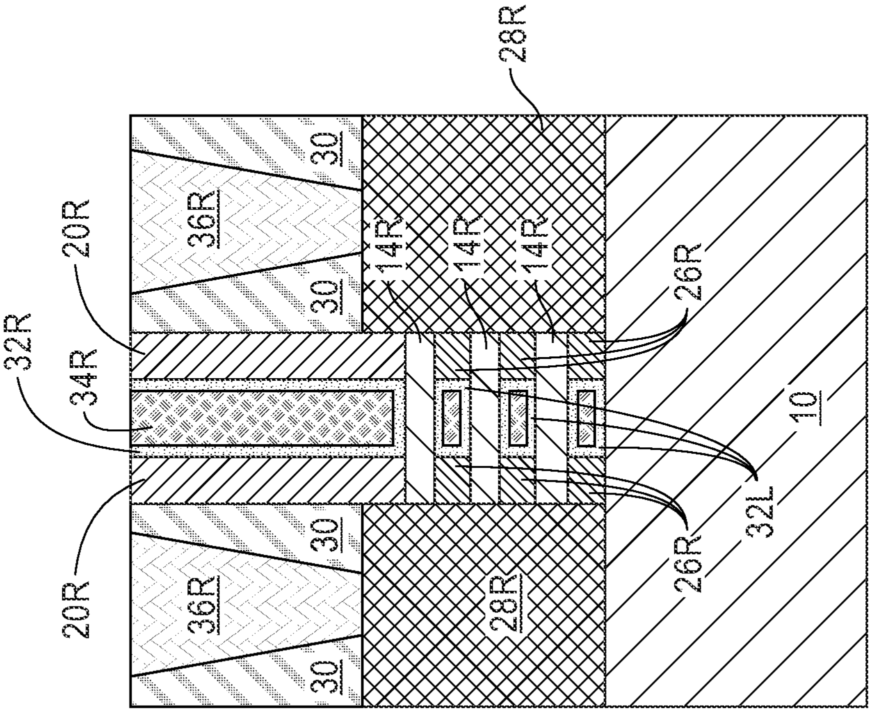
FIG. 7B is a cross sectional view of the structure shown in FIG. 6B after forming a second source/drain contact in the interlayer dielectric material and contacting a surface of the second source/drain region.
Figure 7A:
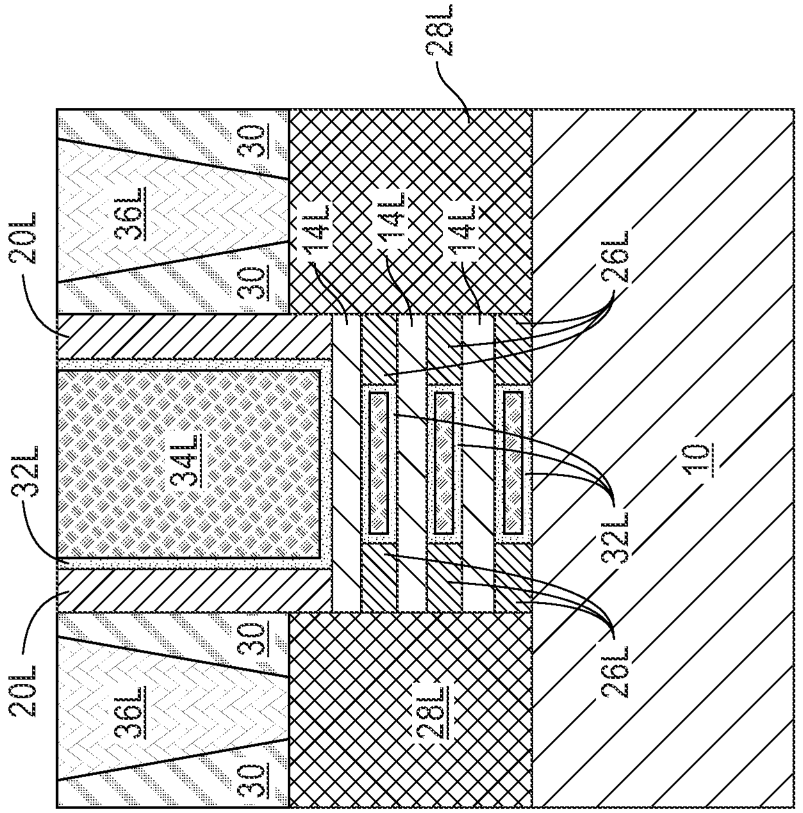
FIG. 7A is a cross sectional view of the structure shown in FIG. 6A after forming a first source/drain contact in the interlayer dielectric material and contacting a surface of the first source/drain region.

Referring now to FIGS. 7A-7B, there are illustrated the structures shown in FIGS. 6A-6B, respectively, after forming a first source/drain contact 36L in the interlayer dielectric material layer 30 and contacting a surface of the first source/drain region 28L, and a second source/drain contact 36R in the interlayer dielectric material layer 30 and contacting a surface of the second source/drain region 28R. In some embodiments (not shown), a contact liner can be present along the sidewalls and bottom wall of the first source/drain contact 36L and/or the second source/drain contact 36R. In one or more embodiments in which a contact liner is present, the contact liner (not shown) can include a silicide liner, such as Ti, Ni, NiPt, etc., and a diffusion barrier material. Exemplary diffusion barrier materials include, but are not limited to, Ru, TiN, TaN, WN, WC, an alloy thereof, or a stack thereof such as Ti/TiN and Ti/WC. The contact liner can be formed utilizing a conformal deposition process including PVD, CVD, PECVD or ALD. The contact liner that is formed can have a thickness ranging from 1 nm to 8 nm, although lesser and greater thicknesses can also be employed. Each of the first source/drain contact 36L and the second source/drain contact 36R includes a contact conductor material such as, for example, W, Cu, Al, Co, Ru, Mo, Os, Ir, Rh or an alloy thereof. The contact conductor material can be formed by any suitable deposition method such as, for example, ALD, CVD, PVD or plating. A planarization process can be used to remove the contact conductor material and the contact liner (when provided) that are located above the ILD material layer 30. The remaining contact conductor material and if present, the contact liner provides the source/drain contact in the respective device region. The contact conductor material that provides the first source/drain contact 36L can be compositionally the same as, or compositionally different from, the contact conductor material that provides the second source/drain contact 36R. It is noted that the different inner spacer thickness in the two device regions supports usage of both the core logic device and the I/O device which typically operate at different voltages. Thus, a more reliable integrated core logic device and I/O device structure is provided. In this embodiment, the dielectric spacers in the core logic device and the I/O device can have the same thickness.

Figure 8A:
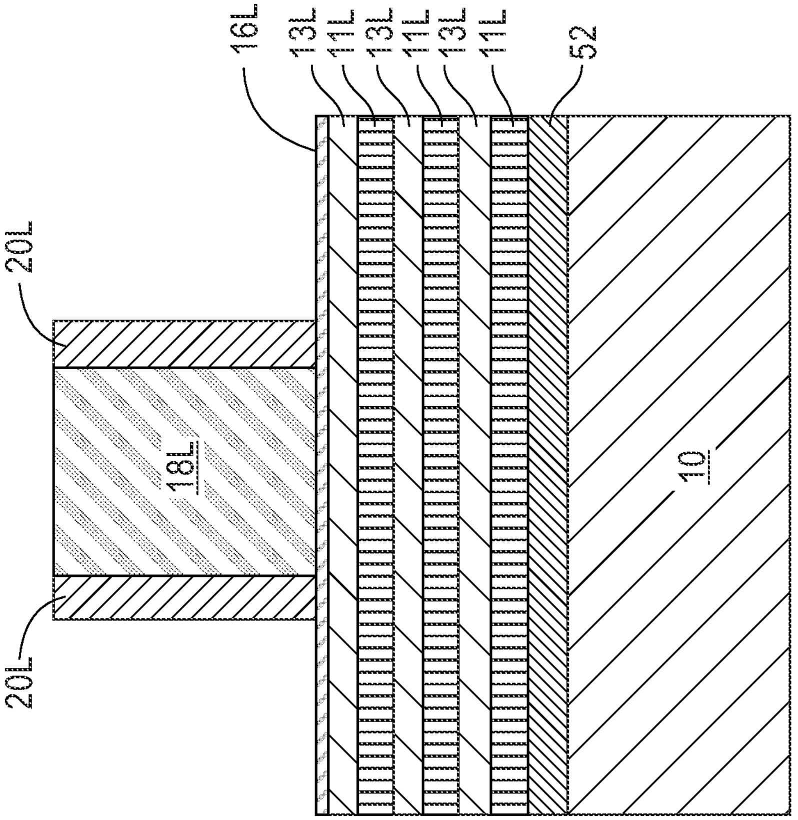
FIG. 8A is a cross sectional view of an initial structure in an I/O device region that can be employed in fabricating a gate-all-around I/O device in accordance with an embodiment of the present application, the initial structure in the I/O device region including a first material stack of alternating layers of a first sacrificial semiconductor material and a first semiconductor channel material, a first sacrificial gate dielectric material layer located on the first material stack, a first sacrificial gate material layer located on, and straddling over, the first material stack, and a first dielectric spacer located laterally adjacent to the first sacrificial gate material.

Reference is now made to FIGS. 8A-12B, which illustrate a second method of the present application. This method begins by providing the initial structures shown in FIGS. 8A-8B. Notably, FIG. 8A shows an initial structure in an I/O device region that can be employed in fabricating a gate-all-around I/O device in accordance with an embodiment of the present application, the initial structure in the I/O device region including a first material stack of alternating layers of a first sacrificial semiconductor material (i.e., first sacrificial semiconductor layer 11L) and a first semiconductor channel material (i.e., second semiconductor channel material layer (13L), a first sacrificial gate dielectric material layer 16L located on the first material stack, a first sacrificial gate material layer 18L located on, and straddling over, the first material stack, and a first dielectric spacer 20L located laterally adjacent to the first sacrificial gate material 18L. FIG. 8B shows an initial structure in a core logic device region that can be employed in fabricating a gate-all-around core logic device in accordance with an embodiment of the present application, the initial structure in the core logic device region as shown in FIG. 8B includes a second material stack of alternating layers of a second sacrificial semiconductor material (second sacrificial semiconductor layer 11R) and a second semiconductor channel material (second semiconductor channel material layer 13R), a second sacrificial gate dielectric material layer 16R located on the second material stack, a second sacrificial gate material layer 18R located on, and straddling over, the second material stack, and a second dielectric spacer 20R located laterally adjacent to the second sacrificial gate material layer 18R.

In the illustrated embodiment, dielectric material layer 52 can be positioned between the semiconductor substrate 10 and each of the material stacks. Dielectric material layer 52 can effectively limit punch through from short channel length and improve leakage. The dielectric material layer 52 is composed of a dielectric material such as for example, silicon nitride, and it can be formed utilizing techniques well known in the art. In embodiments, dielectric material layer 52 can be omitted.

Each material stack includes an equal number of sacrificial semiconductor material layers and semiconductor channel material layers. In the embodiment illustrated in FIGS. 8A-8B, the first material stack includes three first sacrificial semiconductor material layers 11L and three first semiconductor channel material layers 13L, and the second material stack also includes three second sacrificial semiconductor material layers 11R and three second semiconductor channel material layers 13R. The first sacrificial semiconductor material layers 11L are composed of the first semiconductor material as mentioned above, the first semiconductor channel material layers 13L are composed of the second semiconductor material as mentioned above, the second sacrificial semiconductor material layers 11R are composed of the third semiconductor mentioned as above and the second semiconductor channel material layers 13R are composed of the fourth semiconductor material as mentioned above. An epitaxial growth process can be used to deposit each semiconductor material within the material stack, and the deposited semiconductor layers can then be patterned by lithography and etching so as to provide the first and second material stacks shown in FIGS. 8A-8B.

The first sacrificial gate dielectric material layer 16L, the first sacrificial gate material layer 18L, the first dielectric spacer 20L, second sacrificial gate dielectric material layer 16R, the second sacrificial gate material layer 18R, and the second dielectric spacer 20R include materials as defined above in the previous embodiment of the present application. Also, the first sacrificial gate dielectric material layer 16L, the first sacrificial gate material layer 18L, the first dielectric spacer 20L, second sacrificial gate dielectric material layer 16R, the second sacrificial gate material layer 18R, and the second dielectric spacer 20R can be formed using the basic processes steps mentioned above in forming those components in the initial structures shown in FIGS. 1A-1B.

Figure 8B:
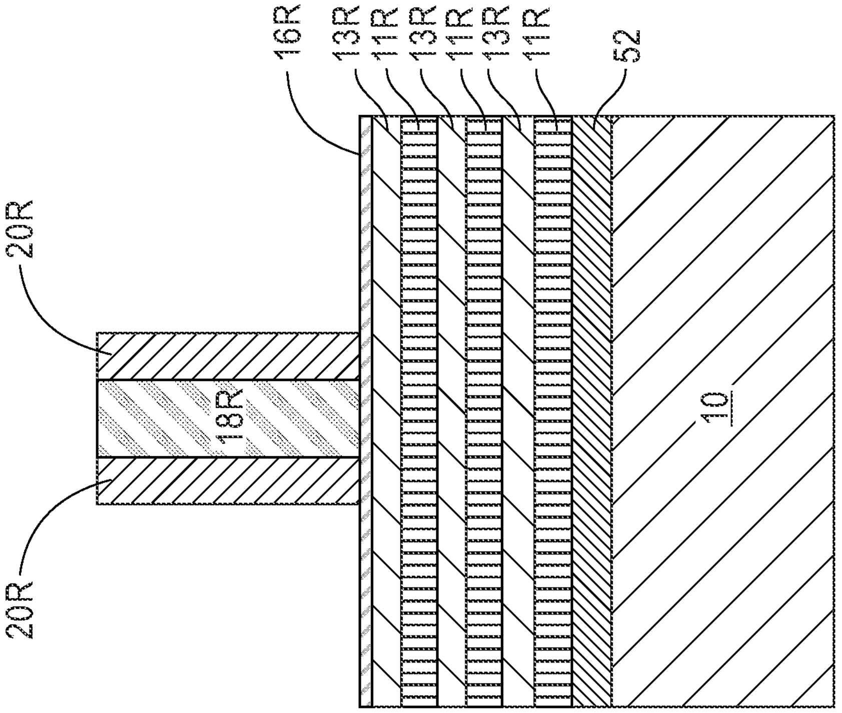
FIG. 8B is a cross sectional view of an initial structure in a core logic device region that can be employed in fabricating a gate-all-around core logic device in accordance with an embodiment of the present application, the initial structure in the core logic device region including a second material stack of alternating layers of a second sacrificial semiconductor material layer and a second semiconductor channel material, a second sacrificial gate dielectric material layer located on the second material stack, a second sacrificial gate material located on, and straddling over, the second material stack, and a second dielectric spacer located laterally adjacent to the second sacrificial gate material.
Figure 9A:
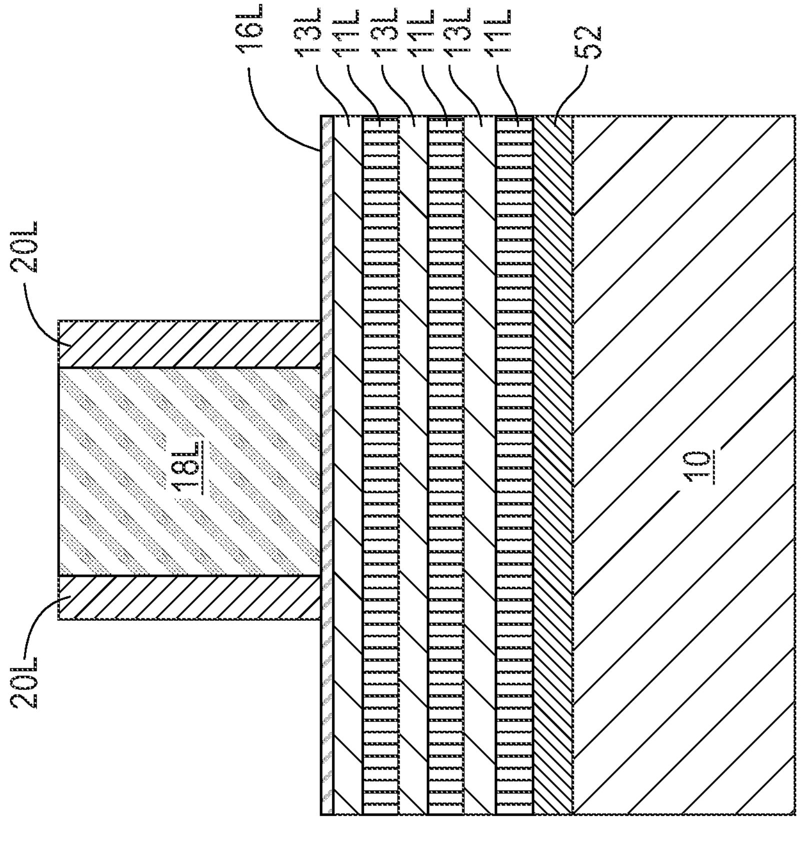
FIG. 9A is a cross sectional view of the initial structure shown in FIG. 8A after forming a mask in the core logic device region.
Figure 9B:
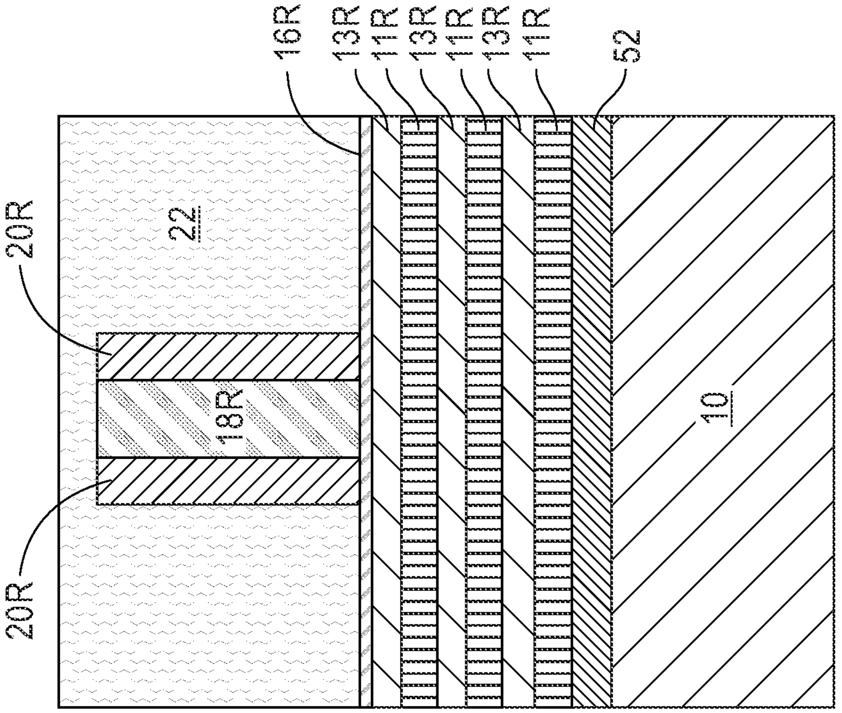
FIG. 9B is a cross sectional view of the initial structure shown in FIG. 8B after forming a mask in the core logic device region.

Referring now FIGS. 9A-9B, there are illustrated the initial structures shown in FIGS. 8A-8B, respectively, after forming a mask 22 in the core logic device region. The mask 22 that is used in this embodiment is the same as mask 22 used in the previously described embodiment of the present application.

Figure 10A:
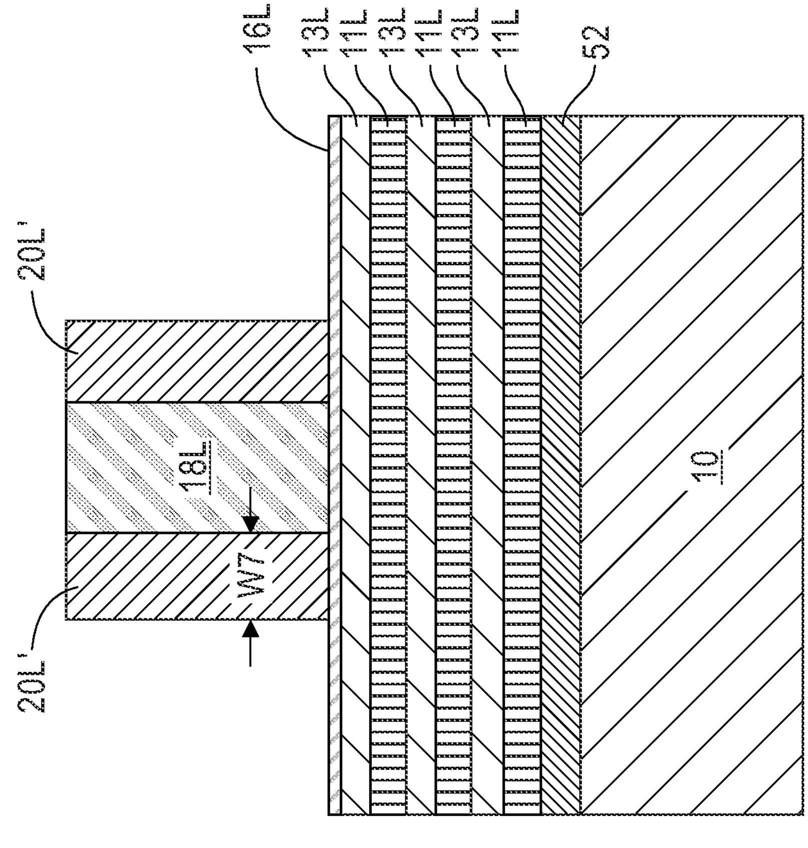
FIG. 10A is a cross sectional view of the structure shown in FIG. 9A after thickening the first dielectric spacer, and thereafter removing the mask.
Figure 10B:
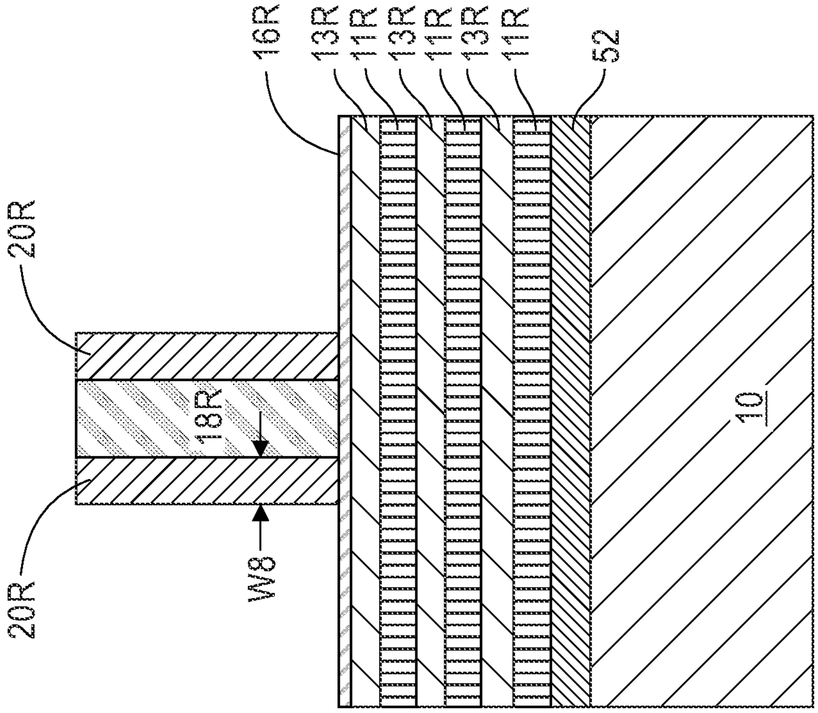
FIG. 10B is a cross sectional view of the structure shown in FIG. 9B after thickening the first dielectric spacer, and thereafter removing the mask.

Referring now FIGS. 10A-10B, there are illustrated the structures shown in FIGS. 9A-9B, respectively after thickening the first dielectric spacer 20L, and thereafter removing the mask 22. The thickened first dielectric spacer is labeled as element 20L' in FIG. 10A. The thickened first dielectric spacer 20L' has a lateral width, W7, that is greater than a lateral width, W8, of the second dielectric spacer 20R. In one embodiment W7 is from 25 nm to 200 nm, while W8 is from 3 nm to 25 nm. The thickening of the first dielectric spacer 20L can include depositing an additional first spacer dielectric material and thereafter performing a spacer etch.

Figure 11B:
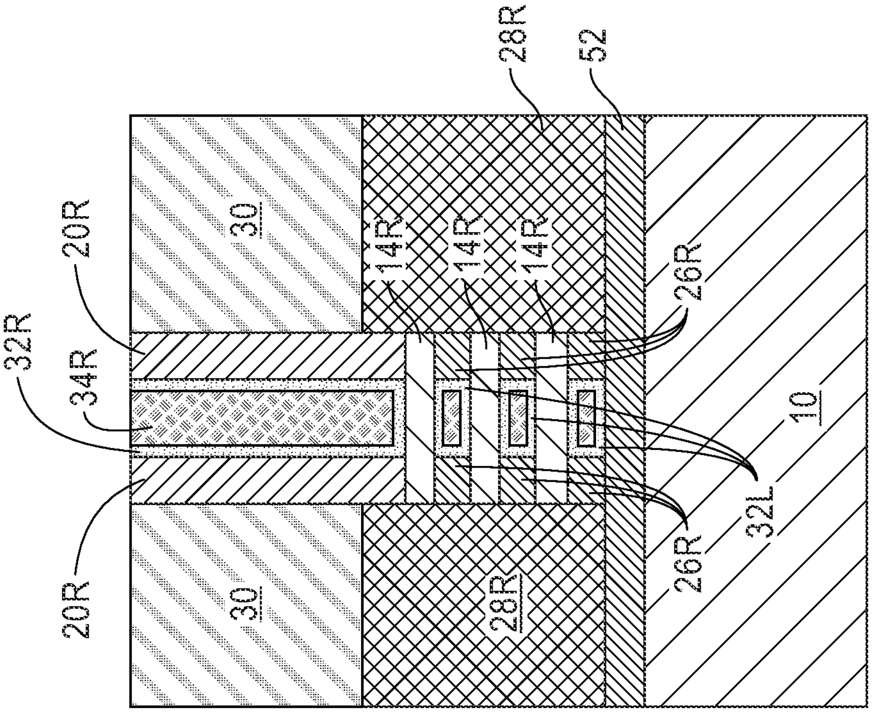
FIG. 11B is a cross sectional view of the structure shown in FIG. 10B after performing further processing steps to provide a gate-all-around device in the core logic device region.
Figure 11A:
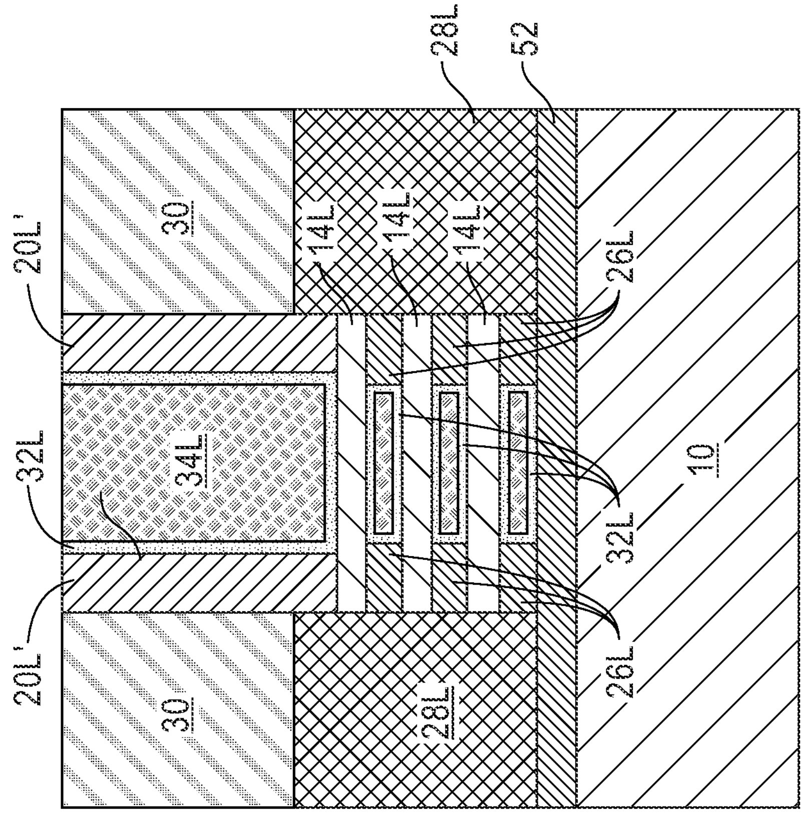
FIG. 11A is a cross sectional view of the structure shown in FIG. 10A after performing further processing steps to provide a gate-all-around device in the I/O device region.

Referring now FIGS. 11A-11B, there are illustrated the structures shown in FIGS. 10A-10B, respectively, after performing further processing steps to provide a gate-all-around device in the I/O device region to provide a gate-all-around device in the core logic device region. The additional processing steps included patterning the first sacrificial gate dielectric material layer 16L and the first material stack utilizing the first sacrificial gate material 18L and the thickened first dielectric spacer 20L' as a combined etch mask to provide a patterned first sacrificial gate dielectric material layer and a patterned first material stack of alternating nanosheets of first sacrificial semiconductor material and first semiconductor channel material, and patterning the second sacrificial gate dielectric material layer 16R and the second material stack utilizing the second sacrificial gate material 18R and the second dielectric spacer 20L as a combined etch mask to provide a patterned second sacrificial gate dielectric material layer and a patterned second material stack of alternating nanosheets of second sacrificial semiconductor material and second semiconductor channel material. First and second indentations can then be formed as described above. Next, first and second inner spacers 26L, 26R can be formed into the first and second indentations, respectively. Like in the previously embodiment of the present application, the first inner spacers 26L have lateral width that is wider than a lateral width of the second inner spacers 26R. In this embodiment, the first inner spacers 26L can have a lateral width that is wider, or substantial equal to, a lateral width of the thickened first dielectric spacer 20L'. The second inner spacer 26R can have a lateral width that is substantially equal to the lateral width of the second dielectric spacer 20R.

After forming the inner spacers, each semiconductor channel material nanosheet is suspended as mentioned above in the previous embodiment of the present application, and a gate region is formed as also mentioned above in the previous embodiment of the present application. Source/drain regions and a ILD material as mentioned above in the previous embodiment present application can then be formed to provide the structures shown in FIGS. 11A-11B.

Figure 12B:
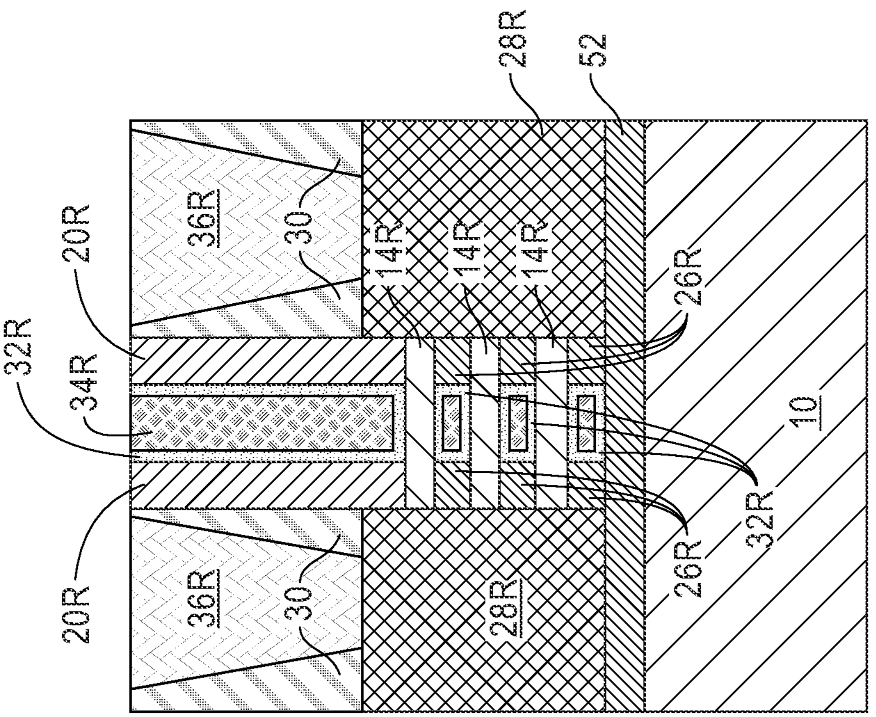
FIG. 12B is a cross sectional view of the structure shown in FIG. 11B after forming a second source/drain contact in the core logic device region.
Figure 12A:
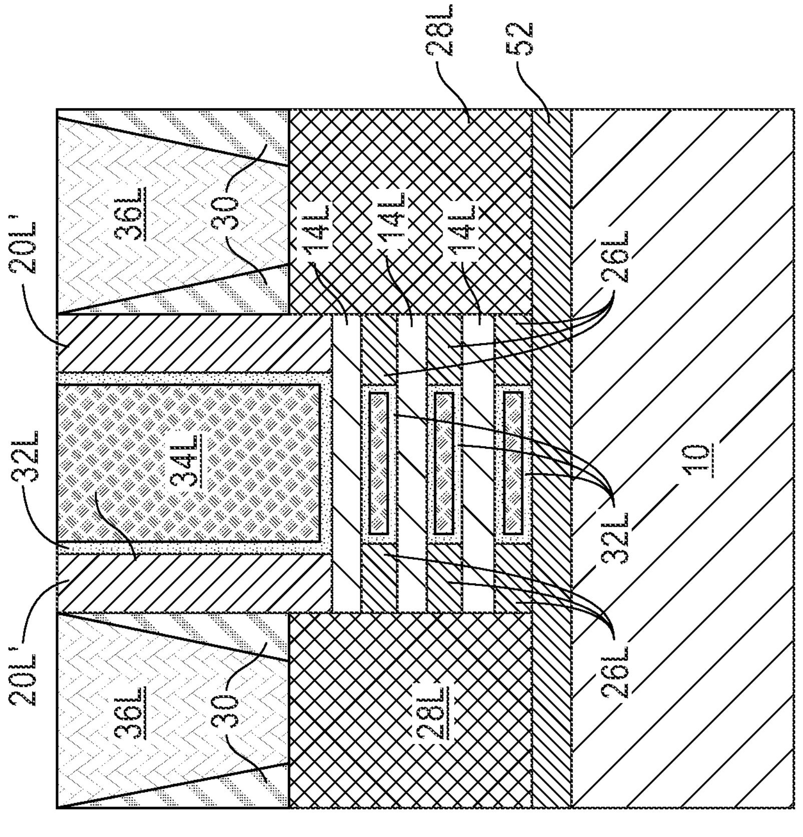
FIG. 12A is a cross sectional view of the structure shown in FIG. 11A after forming a first source/drain contact in the I/O device region.

Referring now FIGS. 12A-12B, there are illustrated the structures shown in FIGS. 11A-11B, respectively, after forming a first source/drain contact 36L in the I/O device region, and a second source/drain contact 36R in the core logic device region. The first source/drain contact 36L and the second source/drain contact 36R are the same as that described above in providing the structures shown in FIGS. 7A-7B.

Referring now to FIGS. 13A-13B, there are illustrated a gate-all-around I/O device in the I/O device region in accordance with another embodiment of the present application, and a gate-all-around core logic device in the core logic device region in accordance with another embodiment of the present application, respectively. The structure shown in this embodiment of the present application are similar to those shown in FIGS. 12A-12B except that an air gap, AG, is present in each of the first dielectric spacer 20L', the first inner spacers 26L, the second dielectric spacer 20R, and the second inner spacers 26. In this embodiment, each air gap is surrounded by a solid dielectric material. In some embodiments of the present application, at least one of the first dielectric spacer 20L', the first inner spacers 26L, the second dielectric spacer 20R, and the second inner spacers 26R includes an air gap surrounded by a solid dielectric material. In yet other embodiments, the at least one, preferably all, of the first dielectric spacer 20L', the first inner spacers 26L, the second dielectric spacer 20R, and the second inner spacers 26R consists entirely of air. It is noted that the different inner spacer thickness in the two device regions supports usage of both the core logic device and the I/O device which typically operate at different voltages. Thus, a more reliable integrated core logic device and I/O device structure is provided. In this embodiment, the dielectric spacer 20L' in I/O device region is laterally wider than the dielectric spacer 20R in the core logic device so provide a reliable gate spacer 20L' for the wide channel device, i.e., the I/O device.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

an I/O device region comprising a first dielectric spacer and first inner spacers, the first dielectric spacer separating a first source/drain contact and an upper portion of a first gate region, and the first inner spacers are located between a first vertical stack of nanosheets and separating a first source/drain region from a lower portion of the first gate region; and a core logic device region comprising a second dielectric spacer and second inner spacers, the second dielectric spacer separating a second source/drain contact and an upper portion of a second gate region, and the second inner spacers are located between a second vertical stack of nanosheets and separating a second source/drain region from a lower portion of the second gate region, wherein the first inner spacers in the I/O device region are laterally wider than the second inner spacers in the core logic device region, and the upper portion of the first gate region has a width that is greater than an entirety of the lower portion of the first gate region, and the lower portion of the first gate region has a constant width from one sidewall to an opposing sidewall and as measured from bottom to top.

2. The semiconductor structure of claim 1, wherein the first dielectric spacer in the I/O device region is laterally wider than the second dielectric spacer in the core logic device region.

3. The semiconductor structure of claim 1, wherein the first dielectric spacer and the first inner spacers are laterally wider than the second dielectric spacer and the second inner spacers.

4. The semiconductor structure of claim 1, wherein each nanosheet of the first vertical stack of nanosheets in the I/O device region is laterally wider than each nanosheet of the second vertical stack of nanosheets in the core logic device region.

5. The semiconductor structure of claim 1, wherein each of the first dielectric spacer, the first inner spacers, the second dielectric spacer, and the second inner spacers comprises an air gap surrounded by a solid dielectric material.

6. The semiconductor structure of claim 1, wherein each of the first dielectric spacer, the first inner spacers, the second dielectric spacer, and the second inner spacers comprises a solid dielectric material.

7. The semiconductor structure of claim 6, wherein the solid dielectric material that provides the first dielectric spacer and the second dielectric spacer is compositionally the same as the solid dielectric material that provides the first inner spacers and the second inner spacers.

8. The semiconductor structure of claim 6, wherein the solid dielectric material that provides the first dielectric spacer and the second dielectric spacer is compositionally different from the solid dielectric material that provides the first inner spacers and the second inner spacers.

9. The semiconductor structure of claim 1, wherein each of the first dielectric spacer, the first inner spacers, the second dielectric spacer, and the second inner spacers comprises an air gap.

10. The semiconductor structure of claim 1, wherein the first gate region has a first channel length and the second gate region has a second channel length, and the second channel length is less than the first channel length.

11. The semiconductor structure of claim 1, wherein the first source/drain region extends outward from a sidewall of each nanosheet of the first vertical stack of nanosheets, and the second source/drain region extends outward from a sidewall of each nanosheet of the second vertical stack of nanosheets.

12. The semiconductor structure of claim 1, wherein the I/O device region is present in a first portion of a semiconductor substrate and the core logic device region is located in a second portion of the semiconductor substrate which is located laterally adjacent to the first portion of the semiconductor substrate.

13. The semiconductor structure of claim 12, wherein the first source/drain region, the second source/drain region, a bottommost portion of the first gate region, and a bottommost portion of the second gate region are each in direct physical contact with the semiconductor substrate.

14. The semiconductor structure of claim 12, wherein the first source/drain region and the second source/drain region are spaced apart from the semiconductor substrate by a dielectric material layer, the dielectric material layer also extends beneath both the first vertical stack of nanosheets and the second vertical stack of nanosheets.

15. A semiconductor structure comprising:

an I/O device region comprising a first dielectric spacer and first inner spacers, the first dielectric spacer separating a first source/drain contact and an upper portion of a first gate region, and the first inner spacers are located between a first vertical stack of nanosheets and separating a first source/drain region from a lower portion of the first gate region; and a core logic device region comprising a second dielectric spacer and second inner spacers, the second dielectric spacer separating a second source/drain contact and an upper portion of a second gate region, and the second inner spacers are located between a second vertical stack of nanosheets and separating a second source/drain region from a lower portion of the second gate region, wherein the first dielectric spacer in the I/O device region is laterally wider than the second dielectric spacer in the core logic device region and the upper portion of the first gate region has a width that is greater than an entirety of the lower portion of the first gate region, and the lower portion of the first gate region has a constant width from one sidewall to an opposing sidewall and as measured from bottom to top.

16. The semiconductor structure of claim 15, wherein the first dielectric spacer and the first inner spacers are laterally wider than the second dielectric spacer and the second inner spacers.

17. The semiconductor structure of claim 15, wherein each nanosheet of the first vertical stack of nanosheets in the I/O device region is laterally wider than each nanosheet of the second vertical stack of nanosheets in the core logic device region.

18. The semiconductor structure of claim 15, wherein each of the first dielectric spacer, the first inner spacers, the second dielectric spacer, and the second inner spacers comprises an air gap surrounded by a solid dielectric material.

19. The semiconductor structure of claim 15, wherein each of the first dielectric spacer, the first inner spacers, the second dielectric spacer, and the second inner spacers comprises a solid dielectric material.

20. The semiconductor structure of claim 15, wherein each of the first dielectric spacer, the first inner spacers, the second dielectric spacer, and the second inner spacers comprises an air gap.

* * * * *